（12）United States Patent
Kang et al.

(10) Patent No.: US 11,335,689 B2
(45) Date of Patent: May 17, 2022

(54) DRAM DEVICE INCLUDING AN AIR GAP AND A SEALING LAYER

(71) Applicant: Samsung Electronics Co., Ltd., Suwon-si (KR)

(72) Inventors: Yoongoo Kang, Hwaseong-si (KR); Wonseok Yoo, Seoul (KR); Hokyun An, Seoul (KR); Kyungwook Park, Pohang-si (KR); Dain Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/837,274

(22) Filed: Apr. 1, 2020

(65) Prior Publication Data

US 2021/0066304 A1 Mar. 4, 2021

(30) Foreign Application Priority Data

Aug. 28, 2019 (KR) .................. 10-2019-0105873

(51) Int. Cl.
*H01L 27/108* (2006.01)
*G11C 5/06* (2006.01)
*H01L 29/06* (2006.01)

(52) U.S. Cl.
CPC ........ *H01L 27/10814* (2013.01); *G11C 5/063* (2013.01); *H01L 27/10855* (2013.01); *H01L 27/10873* (2013.01); *H01L 27/10885* (2013.01); *H01L 29/0649* (2013.01)

(58) Field of Classification Search
CPC ......... H01L 27/10814; H01L 27/10873; H01L 27/10855; H01L 27/10885; H01L 29/0649; H01L 27/10808; H01L 27/10835; H01L 27/1087; H01L 27/10876; H01L 27/10888; H01L 21/76837; H01L 21/7682; H01L 21/76829; H01L 21/76852; H01L 21/76816; G11C 5/063; G11C 7/18
See application file for complete search history.

(56) References Cited

U.S. PATENT DOCUMENTS

| 7,109,086 B2 | 9/2006 | Kammler et al. |
| 7,884,014 B2 | 2/2011 | Jang |
| 8,372,489 B2 | 2/2013 | Hautala |

(Continued)

FOREIGN PATENT DOCUMENTS

| KR | 10-2015-0032133 A | 3/2015 |
| KR | 10-2017-0074777 A | 6/2017 |

*Primary Examiner* — Jonathan Han
(74) *Attorney, Agent, or Firm* — Muir Patent Law, PLLC

(57) ABSTRACT

A DRAM device includes an isolation region defining source and drain regions in a substrate, a first bit line structure connected to the source region, a second bit line structure disposed on the isolation region, an inner spacer vertically extending on a first sidewall of the first bit line structure, an air gap is between the inner spacer and an outer spacer, a storage contact between the first and second bit line structures and connected to the drain region, a landing pad structure vertically on the storage contact, and a storage structure vertically on the landing pad structure. The sealing layer seals a top of the first air gap. The sealing layer includes a first sealing layer on a first sidewall of a pad isolation trench, and a second sealing layer on a second sidewall of the pad isolation trench and separated from the first sealing layer.

20 Claims, 26 Drawing Sheets

(56) References Cited

U.S. PATENT DOCUMENTS

| | | |
|---|---|---|
| 9,054,217 B2 | 6/2015 | Kim |
| 9,418,998 B2* | 8/2016 | Kim ..................... H01L 21/768 |
| 9,520,284 B1 | 12/2016 | Chen et al. |
| 9,847,278 B2* | 12/2017 | Kim .................... H01L 29/0649 |
| 2015/0171163 A1* | 6/2015 | Lee ..................... H01L 21/762 |
| | | 257/506 |
| 2017/0005166 A1* | 1/2017 | Park ................. H01L 27/10888 |
| 2017/0178899 A1 | 6/2017 | Kabansky et al. |
| 2018/0226290 A1* | 8/2018 | Lee .................... H01L 21/7682 |
| 2018/0233357 A1 | 8/2018 | Kabansky et al. |
| 2018/0350817 A1* | 12/2018 | Wang ................ H01L 27/10885 |
| 2020/0066729 A1* | 2/2020 | Simsek-Ege ........ G11C 11/4087 |

\* cited by examiner

DRAM DEVICE INCLUDING AN AIR GAP AND A SEALING LAYER

CROSS-REFERENCE TO RELATED APPLICATION

This application claims priority under 35 U.S.C. § 119 to Korean Patent Application No. 10-2019-0105873, filed on Aug. 28, 2019, the disclosure of which is incorporated by reference herein in its entirety.

BACKGROUND

1. Field

The present disclosure relates to a dynamic random access memory (DRAM) device having an air gap and a sealing layer formed using directional deposition processes and methods of manufacturing the DRAM device.

2. Description of Related Art

As integration of DRAM devices become higher, design rules thereof become finer. To reduce parasitic capacitance between a bit line structure and a landing pad, forming an air gap therebetween has been proposed. In order to form the air gap, after removing sacrificial layer, sufficient sealing process must be performed to stably seal the air gap. For this purpose, a pad isolation trench with sufficient width is required. As the pad isolation trench becomes wider, the landing pad becomes narrower so that the resistance of the landing pad increases. If the pad isolation trench is not wide enough, air gap sealing may be unstable and damage due to chemical or radical penetration may occur.

SUMMARY

An exemplary embodiment of the present disclosure provides a DRAM device in which an air gap is sealed using a relatively thin sealing layer.

An exemplary embodiment of the present disclosure provides a method of sealing an air gap using a relatively thin sealing layer.

According to an exemplary embodiment of the present invention, a DRAM device includes an isolation region defining a source region and a drain region disposed in a substrate, a first bit line structure disposed on the substrate and connected to the source region, a second bit line structure disposed on the isolation region and spaced apart from the first bit line structure in a first horizontal direction with respect to an upper surface of the substrate, a first inner spacer vertically extending on a first sidewall of the first bit line structure, a first outer spacer spaced apart from the first inner spacer in the first horizontal direction, wherein a lower end of the first outer spacer is higher than a lower end of the first inner spacer, a first air gap is disposed between the first inner spacer and the first outer spacer, a storage contact disposed on the substrate, disposed between the first bit line structure and the second bit line structure, and connected to the drain region, a landing pad structure vertically on the storage contact, wherein a stacked structure of the landing pad structure and the storage contact is disposed between the first bit line structure and the second bit line structure, a sealing layer and a pad isolation insulator disposed in a pad isolation trench between the first bit line structure and the landing pad structure, and a storage structure vertically on the landing pad structure. The first inner spacer and the first outer spacer define opposite sides of the first air gap, and the sealing layer seals a top of the first air gap. The sealing layer includes a first sealing layer formed on a first sidewall of the pad isolation trench, and a second sealing layer formed on a second sidewall of the pad isolation trench. The first sealing layer and the second sealing layer are separated from each other.

According to an exemplary embodiment of the present invention, a DRAM device includes an isolation region disposed in a substrate to define a source region and a drain region, a bit line structure disposed on the substrate and connected to the source region, an inner spacer, an air gap, an outer spacer, and a first sealing layer disposed on a first sidewall of the bit line structure, a storage contact disposed on the substrate and connected to the drain region, a landing pad structure vertically on the storage contact, a pad isolation insulator disposed in a pad isolation trench between the bit line structure and the landing pad structure, and a storage structure vertically on the landing pad structure. The inner spacer and the outer spacer define opposite sides of the air gap. The first sealing layer is disposed on an outer surface of an upper portion of the inner spacer and an upper surface of the outer spacer, and seals a top of the air gap. The landing pad structure includes a landing pad barrier layer conformally formed on an outer surface of the first sealing layer, and a landing pad on the landing pad barrier layer, a first sidewall of the pad isolation insulator is in contact with the landing pad, a second sidewall of the pad isolation insulator is in contact with at least one of the landing pad barrier layer, the first sealing layer, the inner spacer, and the bit line structure, and a lower portion of the pad isolation insulator and a portion of the second sidewall are in contact with the landing pad barrier layer.

According to an exemplary embodiment of the present invention, a DRAM device includes an isolation region disposed in a substrate to define a source region and a drain region, a bit line structure disposed on the substrate and connected to the source region, an inner spacer, an air gap, and an outer spacer disposed on a first sidewall of the bit line structure, a storage contact disposed on the substrate and connected to the drain region, a landing pad structure on the storage contact, a pad isolation trench between the bit line structure and the landing pad structure, and a recess trench below the pad isolation trench, a sealing layer and a pad isolation insulator disposed in the pad isolation trench and the recess trench, and a storage structure on the landing pad structure. The inner spacer and the outer spacer define opposite sides of the air gap. The sealing layer includes a first sealing layer formed on a first sidewall of the pad isolation trench and an inner surface of the recess trench, and a second sealing layer formed on a second sidewall of the pad isolation trench and not formed on the inner surface of the recess trench. The first sealing layer and the second sealing layer are separated from each other. The first sealing layer seals a top of the air gap.

According to an exemplary embodiment of the present invention, a method of forming a DRAM device includes forming an isolation region in a substrate, the isolation region defining a source region and a drain region, recessing an upper surface of the source region to form a contact recess, forming a bit line structure on the source region, forming an inner spacer on a first sidewall of the bit line structure, forming a sacrificial spacer on the inner spacer, forming an outer spacer on the sacrificial spacer, wherein the sacrificial spacer is interposed between the inner spacer and the outer spacer, forming a storage contact and a contact buffer layer on the drain region, forming a capping spacer on the inner spacer, the sacrificial spacer, and the outer spacer, conformally forming a landing pad barrier layer on the contact buffer layer and the capping spacer, forming a landing pad on the landing pad barrier layer, forming a trench between the landing pad and the bit line structure to expose a top portion of the sacrificial spacer, removing the sacrificial spacer through the trench to form an air gap, forming a first sealing layer on a first sidewall of the trench to seal a top of the air gap, forming a second sealing layer on a second sidewall of the trench, forming a pad isolation insulator between the first sealing layer and the second sealing layer to fill the trench, and forming a storage structure on the landing pad.

According to an exemplary embodiment of the present invention, a method of forming a DRAM device includes forming an isolation region defining a source region and a drain region in a substrate, forming a first bit line structure connected to the source region on the substrate, forming a second bit line structure on the isolation region, forming a first inner spacer, a first air gap, a first outer spacer, and a first sealing layer on a first sidewall of the first bit line structure, forming a second inner spacer, a second air gap, a second outer spacer, and a second sealing layer on a first sidewall of the second bit line structure, forming a storage contact and a contact buffer layer between the first outer spacer and the second outer spacer, wherein the storage contact is connected to the drain region, forming a landing pad structure on the contact buffer layer, forming a pad isolation trench between the first bit line structure and the landing pad structure, wherein the pad isolation trench is between the second bit line structure and the landing pad structure, forming a pad isolation insulator in the pad isolation trench, and forming a storage structure on the landing pad structure. The first inner spacer and the first outer spacer define opposite sides of the first air gap. The first sealing layer is formed on an outer surface of an upper portion of the first inner spacer and an upper surface of the first outer spacer, and seals a top of the first air gap. The second sealing layer is formed on an outer surface of an upper portion of the second inner spacer and an upper surface of the second outer spacer, and seals a top of the second air gap. The landing pad structure includes a landing pad barrier layer conformally formed on outer surfaces of the first sealing layer and the second sealing layer and the contact buffer layer, and a landing pad on the landing pad barrier layer. A first sidewall of the pad isolation insulator is in contact with the landing pad. A second sidewall of the pad isolation insulator is in contact with at least one of the landing pad barrier layer, the first sealing layer, the first inner spacer, and the first bit line structure.

BRIEF DESCRIPTION OF THE DRAWINGS

Features will become apparent to those of skill in the art by describing in detail exemplary embodiments with reference to the attached drawings in which.

DETAILED DESCRIPTION OF EXEMPLARY EMBODIMENTS

Figure 1:
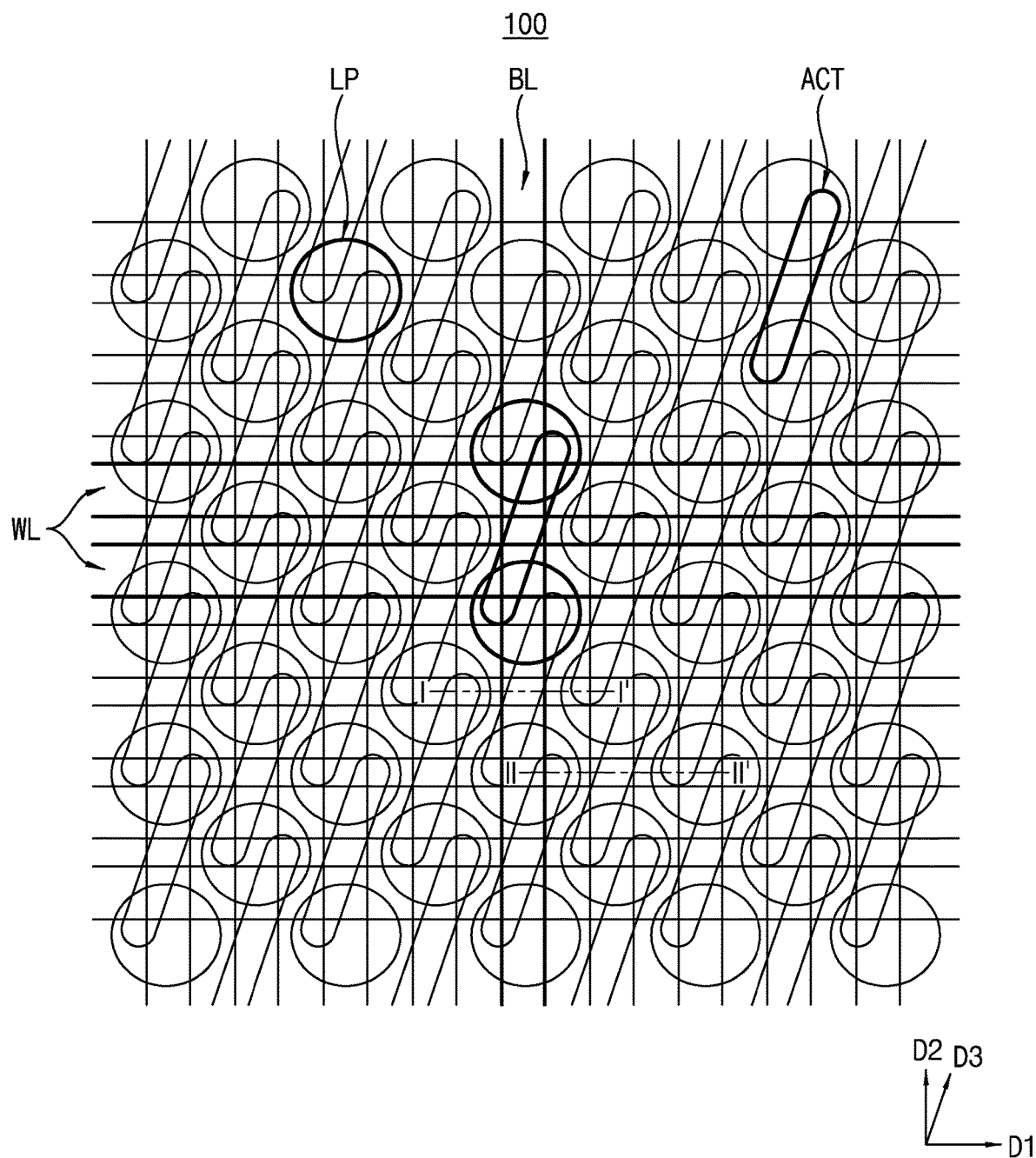
FIG. 1 is a schematic layout of a DRAM device in accordance with an embodiment of the present disclosure.

FIG. 1 is a schematic layout of a DRAM device 100 in accordance with an embodiment of the present disclosure. Referring to FIG. 1, a DRAM device 100 in accordance with an exemplary embodiment may include word lines WL, bit lines BL, active regions ACT, and landing pads LP. The word lines WL may extend in parallel with each other in a first direction D1. The bit lines BL may extend in parallel with each other in a second direction D2. The active regions ACT may be arranged in an elongated island shape in a third direction D3. The landing pads LP may overlap both ends of the adjacent active regions ACT. The first direction D1 may be a row direction, for example an X-direction, the second direction D2 may be a column direction, for example a Y-direction, and the third direction D3 may be a diagonal direction with respect to the first direction D1 and the second direction D2. The first direction D1 and the second direction D2 may be perpendicular to each other. The word lines WL may be arranged to divide the active regions ACT into three equal parts. The bit lines BL may be disposed to pass through centers of the active regions ACT, respectively.

Figure 2A:
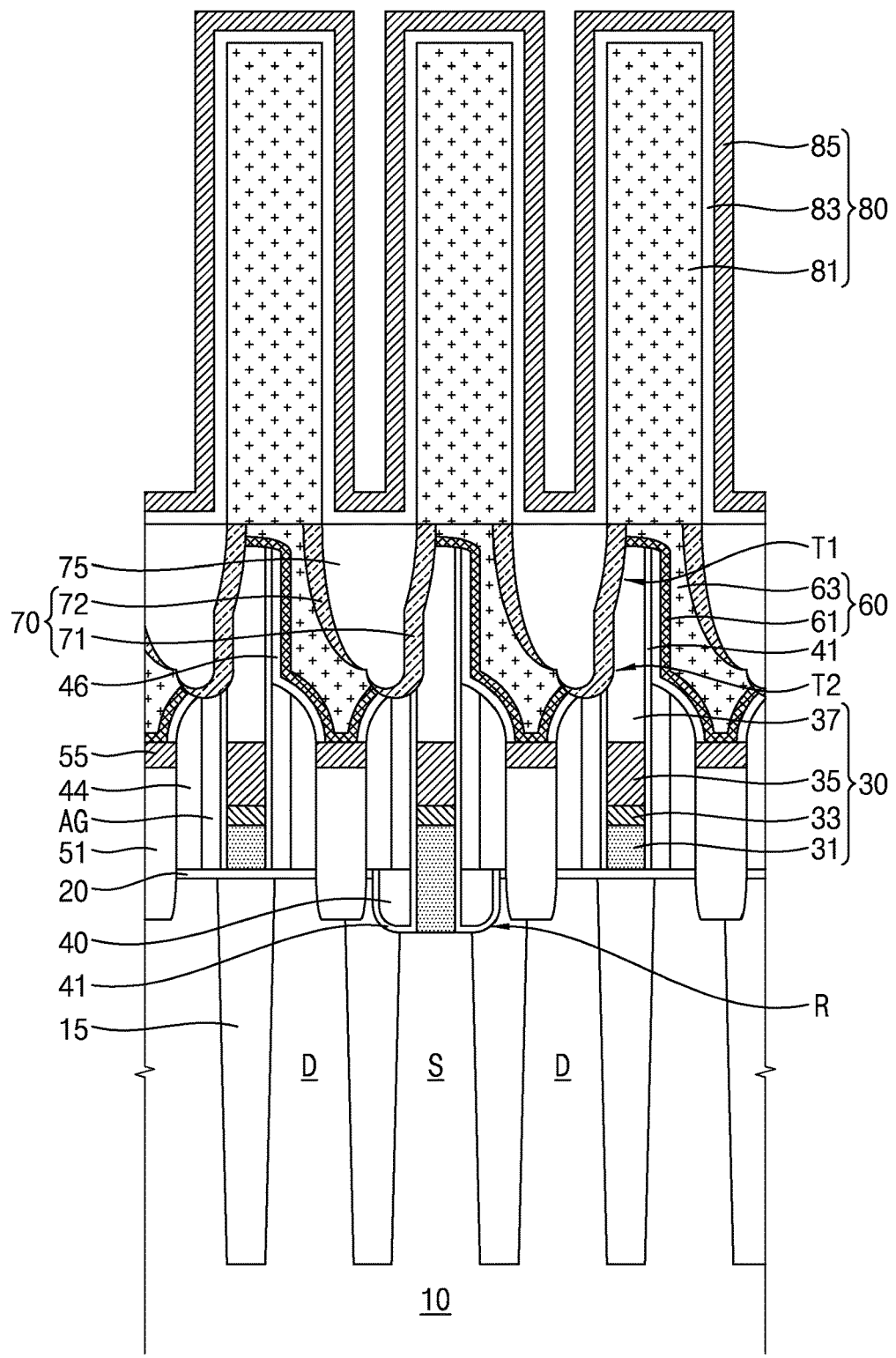
FIGS. 2A and 2B are longitudinal cross-sectional views taken along line I-I' shown in FIG. 1 to schematically show DRAM devices in accordance with embodiments of the present disclosure.
Figure 2B:
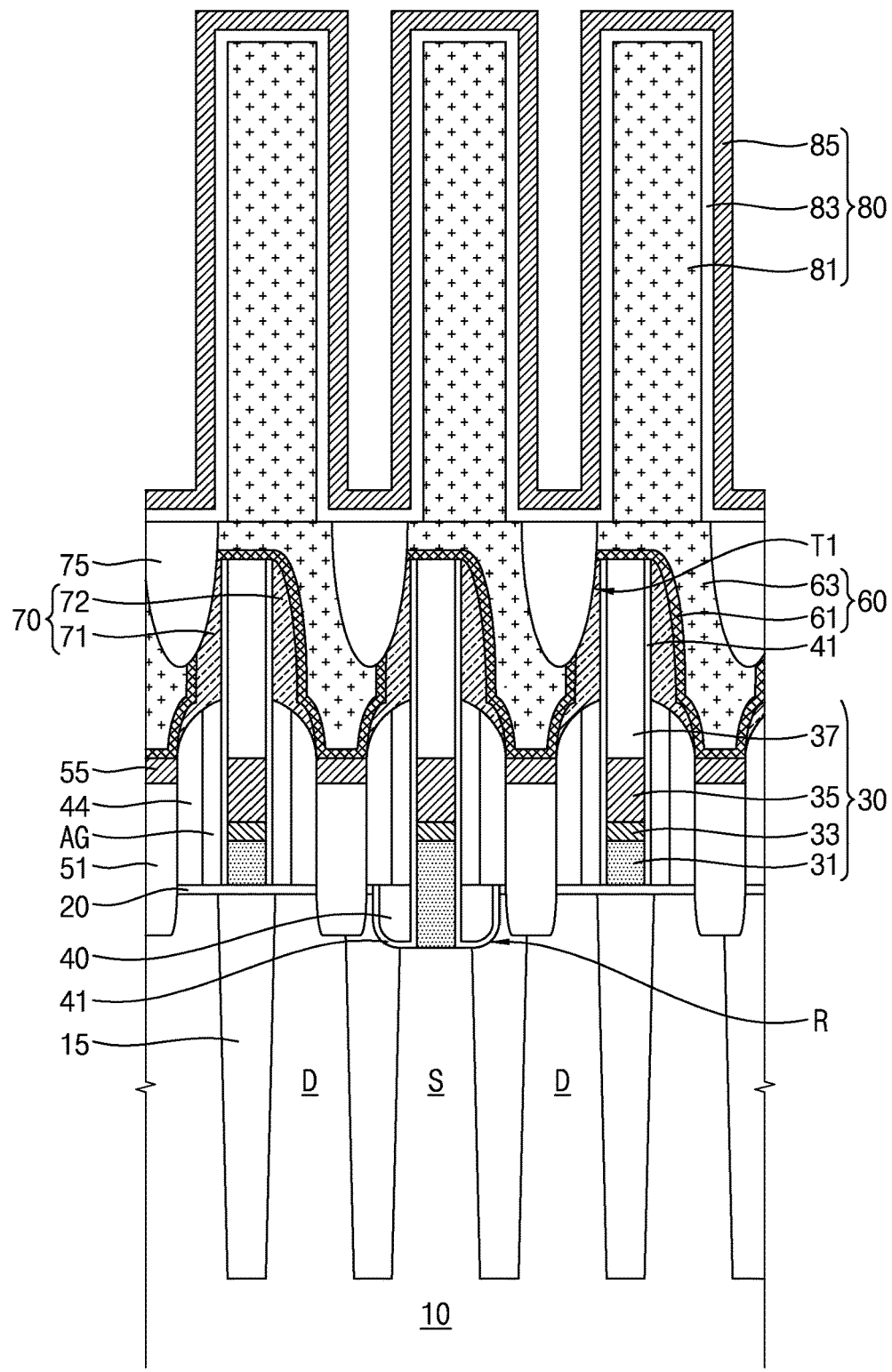

FIGS. 2A and 2B are longitudinal cross-sectional views taken along line I-I' shown in FIG. 1 to schematically show DRAM devices 100A and 100B in accordance with embodiments of the present disclosure. Referring to FIG. 2A, a DRAM device 100A in accordance with an embodiment of the present disclosure may include an isolation region 15 formed in a substrate 10, a bit line structure 30, spacers 41, 44, and 46, an air gap AG, a storage contact 51, a landing pad structure 60, a sealing layer 70, a pad isolation insulator 75, and a storage structure 80. The DRAM device 100A may further include an interlayer insulating layer 20, a contact recess R and a recess filler 40, a pad isolation trench T1, and a recess trench T2.

The substrate 10 may be one of a single crystal silicon wafer, a silicon on insulator (SOI), an epitaxial growth layer, or other semiconducting layers.

The isolation region 15 may define a source region S and a drain regions D in the substrate 10. The isolation region 15 may have a dam shape that fills a trench formed in the substrate 10. The source region S and the drain regions D may be part of different active regions with reference to FIG. 1. For example, one active region ACT may include one source region and two drain regions.

The interlayer insulating layer 20 may be disposed on a surface of the substrate 10. Interlayer insulating layer 20 may include at least one of silicon oxide, silicon nitride, and combinations of various other insulators.

The contact recess R may be formed on the source region S and the isolation region 15 adjacent to the source region S. The contact recess R may be inwardly or downwardly recessed from the surface of the substrate 10. The recess filler 40 may include an insulator filled in the contact recess R. In one embodiment, top surfaces of the recess filler 40 and the interlayer insulating layer 20 may be coplanar.

The bit line structure 30 may include a bit line contact 31, a bit line barrier layer 33, a bit line electrode 35, and a bit line capping layer 37.

The bit line contact 31 may pass through the contact recess R and may be connected to the source region S. The bit line contact 31 may include a conductor such as doped poly-crystalline silicon. The bit line barrier layer 33 may include a barrier metal such as titanium nitride (TiN). The bit line electrode 35 may include metal such as tungsten (W). The bit line capping layer 37 may include an anti-oxidation (i.e., oxidation-resistant) insulating material having a high density such as silicon nitride. Opposite sidewalls of the bit line contact 31, the bit line barrier layer 33, the bit line electrode 35, and the bit line capping layer 37 may be vertically aligned with one another. The bit line contact 31 disposed on the interlayer insulating layer 20 may be insulated from the substrate 10. On the source region S, the bit line contact 31 passing through the contact recess R may have a relatively large height.

The spacers 41, 44, and 46 may include an inner spacer 41, an outer spacer 44, and a capping spacer 46. The air gap AG may be formed between the inner spacer 41 and the outer spacer 44. The inner spacer 41 may be conformally formed on sidewalls of the bit line structure 30. The inner spacer 41 may include a first liner portion and a J-shaped portion connected to a lower end of the first liner portion. The first liner portion may contact the sidewalls of the bit line structure 30. The J-shaped portion may extend conformally from the lower end of the first liner portion onto an inner surface of the contact recess R. The inner spacer 41 may conformally extend in a U-shape onto the inner surface of the contact recess R. The outer spacer 44 may be spaced apart from the inner spacer 41 by the air gap AG. A height of the outer spacer 44 may be a middle height of the bit line structure 30. In an example embodiment, lower ends of the outer spacers 44 may be higher than a lower end of the inner spacer 41 (i.e., the lower end of the first liner portion thereof). The capping spacer 46 may be conformally formed on an upper outer surface of the inner spacer 41, and a top surface and an upper outer surface of the outer spacer 44. The capping spacer 46 may be disposed on tops of some air gaps AG. For example, the tops of some air gap AG may be sealed by the capping spacer 46.

The air gap AG may be defined to be surrounded by the interlayer insulating layer 20 or the recess filler 40, the inner spacer 41, the outer spacer 44, the capping spacer 46, and/or the sealing layer 70. For example, a bottom of the air gap AG may be defined by either the interlayer insulating layer 20 or the recess filler 40, opposite sides of the air gap AG may be defined by the inner spacer 41 and the outer spacer 44, and the top of the air gap AG may be defined by either the capping spacer 46 or the sealing layer 70. For example, the air gap AG on the isolation region 15 may include the bottom sealed by the interlayer insulating layer 20, and the air gap AG on the source region S may include the bottom sealed by the recess filler 40.

The storage contact 51 may be in contact with and be connected to the drain regions D of the substrate 10. The storage contact 51 may protrude downwardly into the substrate 10. For example, surfaces of the drain regions D of the substrate 10 may be recessed to be in contact with the storage contact 51. The storage contact 51 may be disposed between the outer spacers 46. The storage contact 51 may include a conductive material such as doped poly-crystalline silicon.

The DRAM device 100A may further include a contact buffer layer 55 disposed on a top surface of the storage contact 51. For example, the contact buffer layer 55 may include tungsten silicide (WSi), titanium silicide (TiSi), tantalum silicide (TaSi), nickel silicide (NiSi), cobalt silicide (CoSi), or one of various metal silicides. In one embodiment, the contact buffer layer 55 may include a barrier layer such as titanium nitride (TiN).

The landing pad structure 60 may be disposed on the storage contact 51 or the contact buffer layer 55 between the bit line structures 30. The landing pad structure 60 may include a landing pad barrier layer 61 and a landing pad 63. The landing pad barrier layer 61 may be conformally disposed on a portion of a top surface of the bit line structure 30, an outer surface of the capping spacer 46, and a top surface of the contact buffer layer 55. The landing pad barrier layer 61 may include a barrier metal such as titanium nitride (TiN). The landing pad 63 may be disposed in a form of a plug on the landing pad barrier layer 61.

The sealing layer 70 and the pad isolation insulator 75 may fill a pad isolation trench T1 and a recess trench T2 between the landing pad structures 60. The pad isolation trench T1 may physically separate the landing pad structures 60 from each other. Referring to FIG. 1, the pad isolation trench T1 may have a trench shape that defines the landing pads LP. The recess trench T2 may be concavely recessed from a bottom surface of the pad isolation trench T1 toward the air gap AG. The sealing layer 70 and the pad isolation insulator 75 filling the inside of the pad isolation trench T1 may protrude downward into the recess trench T2.

The sealing layer 70 may include a first sealing layer 71 and a second sealing layer 72. The first sealing layer 71 may be disposed in a form of a liner on a first inner sidewall (i.e., side surface) of the pad isolation trench T1, and may extend onto a first inner sidewall (i.e., side surface) of the recess trench T2. The first inner sidewall of the pad isolation trench T1 may be connected to the first inner sidewall of the recess trench T2. The second sealing layer 72 may be disposed in a form of a liner on a second inner sidewall of the pad isolation trench T1. The first inner sidewall and the second inner sidewall may face each other and spaced apart from each other in the first direction D1. The second sealing layer 72 may not be formed in the recess trench T2. In one embodiment, the second sealing layer 72 may be thinly formed in the recess trench T2. A horizontal width of an upper portion of each of the first sealing layer 71 and the second sealing layer 82 may be wider than a horizontal width of a lower portion of each of the first sealing layer 71 and the second sealing layer 82 in the pad isolation trench T1. For example, the first sealing layer 71 and the second sealing layer 72 may have a relatively thick upper portion and a relatively thin lower portion in the pad isolation trench T1. In an example embodiment, the second sealing layer 72 may have a gradually-decreasing, horizontal thickness toward the substrate 10 in the pad isolation trench T1. In an example embodiment, the first sealing layer 71 may have a gradually-decreasing, horizontal thickness toward the substrate 10 in the pad isolation trench T1. The first sealing layer 71 and the second sealing layer 72 may be spaced apart from each other not to be connected to each other. In one embodiment, the first sealing layer 71 and the second sealing layer 72 may be thinly connected under the pad isolation trench T1 and/or the recess trench T2. The pad isolation insulator 75 may be disposed on the first sealing layer 71 and the second sealing layer 72 to fill the pad isolation trench T1 and the recess trench T2. For example, the first sealing layer 71 may be formed on a first sidewall of the pad isolation insulator 75, and the second sealing layer 72 may be formed on a second sidewall of the pad isolation insulator 75. The second sealing layer 72 may not be formed on a bottom of the pad isolation trench T1 and/or inside the recess trench T2. In one embodiment, a portion of a bottom of the pad isolation insulator 75 may be in contact with the landing pad structure 60, for example, in the recess trench T2.

Most of the landing pad 63 may be in contact with the second sealing layer 72 in the pad isolation trenches T1. On the bottom of the pad isolation trench T1, the landing pad 63 and the pad isolation insulator 75 may be in contact with each other. The landing pad barrier layer 61 may not be in contact with the second sealing layer 72. On the bottom of the pad isolation trench T1, the landing pad barrier layer 61 and the pad isolation insulator 75 may contact each other. The present invention is not limited thereto. In an example embodiment, in the recess trench T2, the landing pad barrier layer 61 and the pad isolation insulator 75 may contact each other. In an example embodiment, in the recess trench T2, the landing pad barrier layer 61 and the first sealing layer 71 may contact each other.

The storage structure 80 may be disposed on the landing pad structure 60. The storage structure 80 may include a lower storage electrode 81, a storage dielectric layer 83, and an upper storage electrode 85. The lower storage electrode 81 may have a pillar shape. The storage dielectric layer 83 may be conformally disposed on the lower storage electrode 81. The upper storage electrode 85 may be conformally disposed on the storage dielectric layer 83. In one embodiment, the upper storage electrode 85 may be disposed on the storage dielectric layer 83 to fill between the lower storage electrodes 81.

The DRAM device 100A may be arranged such that a structure of a left and right symmetry is alternately repeated. For example, a first structure adjacent to a left sidewall of the bit line structure 30 may be repeated in the first direction D1, and a second structure adjacent to a right sidewall of the bit line structure 30 may be repeated in the first direction D1. The first structure and the second structure may be alternately disposed in the first direction D1. The first structure may include the first sealing layer 71 and a first air gap of which a top is sealed with the first sealing layer 71. The second structure may include the landing pad structure 60, the capping spacer 46 and a second air gap of which a top is sealed with the capping spacer 46. Therefore, in the longitudinal cross-sectional view taken along line II-IF of FIG. 1, the left and right of the illustrated shape may be changed. In this case, a first profile of the first sealing layer 71 and a second profile of the second sealing layer 72 may be changed, the first inner sidewall and the second inner sidewall of the pad isolation trench T1 may be changed, and the first sidewall and the second sidewall e of the pad isolation insulator 75 may be changed.

Referring to FIG. 2B, a DRAM device 100B in accordance with an embodiment of the present disclosure may include an isolation region 15 formed in a substrate 10, a bit line structure 30, spacers 41 and 44, an air gap AG, a storage contact 51, a landing pad structure 60, a sealing layer 70, a pad isolation insulator 75, and a storage structure 80. The DRAM device 100B may further include an interlayer insulating layer 20, a contact recess R and a recess filler 40, and a pad isolation trench T1. Description of the same reference numerals having the same shape as in FIG. 2A is omitted. Accordingly, the description of the omitted reference numerals and elements can be understood with reference to FIG. 2A.

The capping spacer 46 of FIG. 2A may be omitted. For example, the capping spacer 46 and the sealing layer 70 of FIG. 2A may be combined.

The sealing layer 70 may be conformally formed on the upper outer sidewall of the inner spacer 41 and the upper surface of the outer spacer 44. The upper surface of the outer spacer 44 may be curved. The sealing layer 70 may not cover a portion of the upper surface of the outer spacer 44. For example, a portion of the outer spacer 44 close to the contact buffer layer 55 or a portion of an outer sidewall of the outer spacer 44 close to the contact buffer layer 55 may be exposed without being covered by the sealing layer 70. The sealing layer 70 may be disposed on a top of the air gap AG. For example, the top of the air gap AG may be sealed by the sealing layer 70. The sealing layer 70 may include a first sealing layer 71 and a second sealing layer 72. The first sealing layer 71 may be formed on the first sidewall of the bit line structure 30, and the second sealing layer 72 may be formed on the second sidewall of the bit line structure 30. The first sidewall and the second sidewall may be opposite to each other. For example, the air gap AG formed on the first sidewall of the bit line structure 30 may be sealed by the first sealing layer 71, and the air gap AG formed on the second sidewall of the bit line structure 30 may be sealed by the second sealing layer 72.

The landing pad barrier layer 61 of the landing pad structure 60 may be conformally disposed on a portion of the top surface of the bit line structure 30, the surface of the sealing layer 70, and the surface of the contact buffer layer 55. The landing pad 63 may be disposed in the form of a plug on the landing pad barrier layer 61 between the bit line structures 30.

The pad isolation insulator 75 may be formed in the pad isolation trench T1 between the landing pad structures 60. The pad isolation trench T1 may physically separate the landing pad structures 60 from each other. In comparison with FIG. 2A, the recess trench T2 may be omitted. In comparison with FIG. 2A, the pad isolation trench T1 may be formed relatively small, narrow, and shallow.

FIGS. 3 to 15 are longitudinal cross-sectional views illustrating a method of forming a DRAM device 100A in accordance with an exemplary embodiment of the present disclosure illustrated in FIG. 2A.

Figure 3:
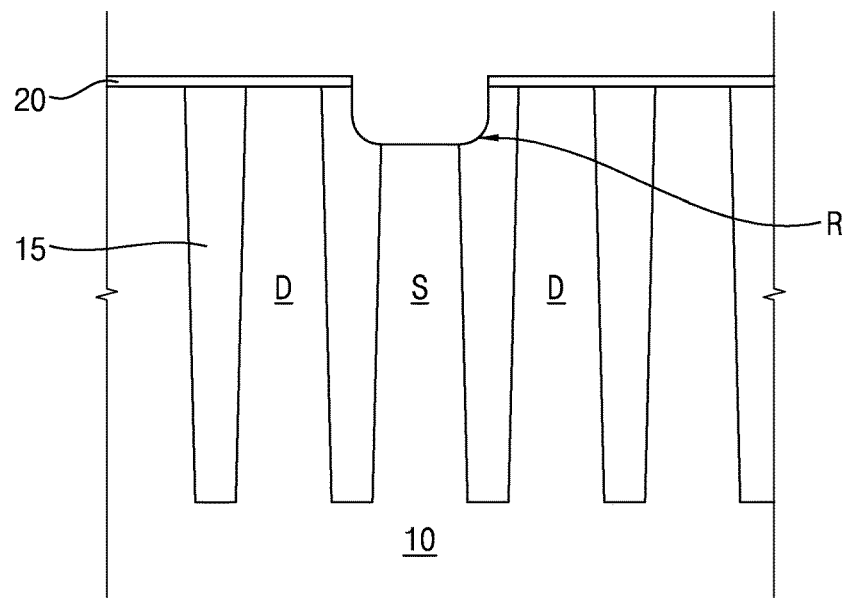
FIGS. 3 to 12, 13A and 13B, 14A and 14B, and 15 are longitudinal cross-sectional views illustrating a method of forming a DRAM device in accordance with an exemplary embodiment of the present disclosure illustrated in FIG. 2A.

Referring to FIG. 3, a method of forming the DRAM device 100A may include forming isolation regions 15 in a substrate 10, forming an interlayer insulating layer 20 on a surface of the substrate 10, and forming a contact recess R.

The forming the isolation regions 15 may include forming trenches in the substrate 10, and filling the trenches with an insulator. The isolation regions 15 may have a dam shape extending to inside of the substrate 10. The source regions S and the drain regions D may be defined by the isolation regions 15. Further referring to FIG. 1, the source region S and the drain regions D may be portions of different active regions ACT, respectively.

The forming of the interlayer insulating layer 20 may include entirely forming an insulator on the surface of the substrate 10. The interlayer insulating layer 20 may include silicon oxide, silicon nitride, or at least one of various insulators.

The forming the contact recess R may include recessing an upper portion of the source region S of the substrate 10 using a selective etch process.

Figure 4:
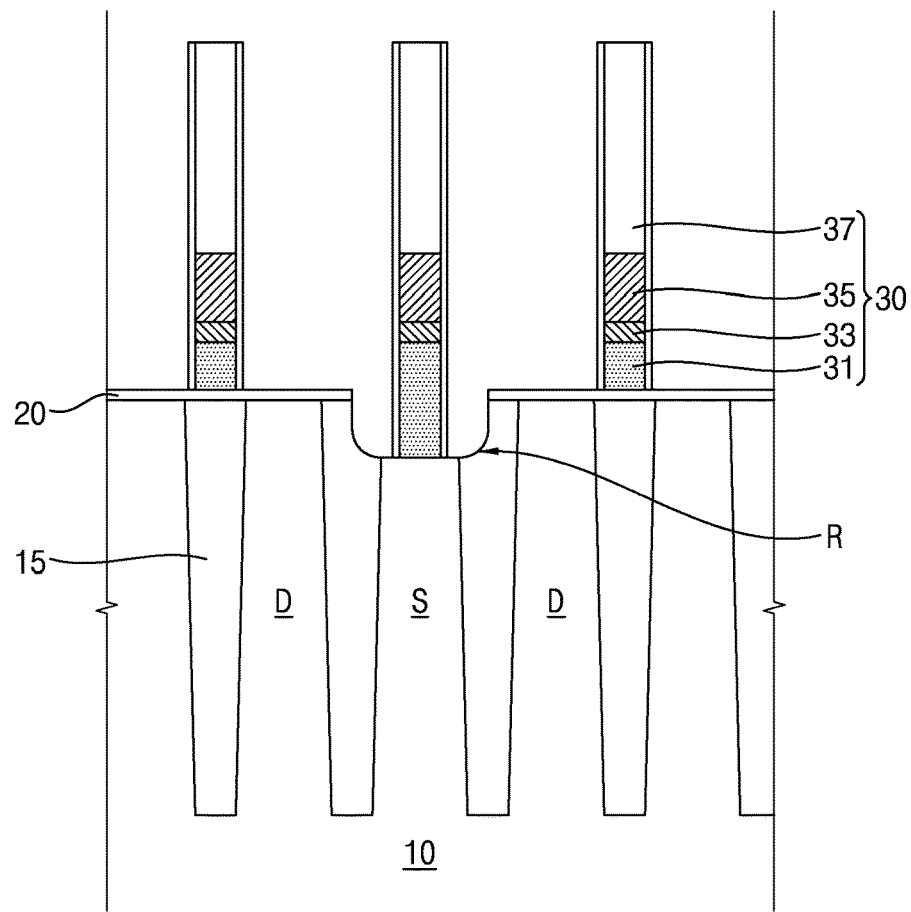

Referring to FIG. 4, the method may include forming a bit line structure 30 including a bit line contact 31, a bit line barrier layer 33, a bit line electrode 35, and a bit line capping layer 37.

The forming of the bit line structure 30 may include forming a bit line contact material layer, a bit line barrier material layer, and a bit line electrode material layer, and a bit line capping material layer on the substrate 10 and performing a patterning process.

For example, the bit line contact 31 may include a conductive material such as doped poly-crystalline silicon. The bit line barrier layer 33 may include a barrier metal such as titanium nitride. The bit line electrode material layer may include metal such as tungsten. The bit line capping layer 37 may include an oxidation-resistant insulating material such as silicon nitride having a higher density than silicon oxide.

The bit line contact 31 on the source region S may extend into the contact recess R to be electrically connected to the source region S.

Figure 5:
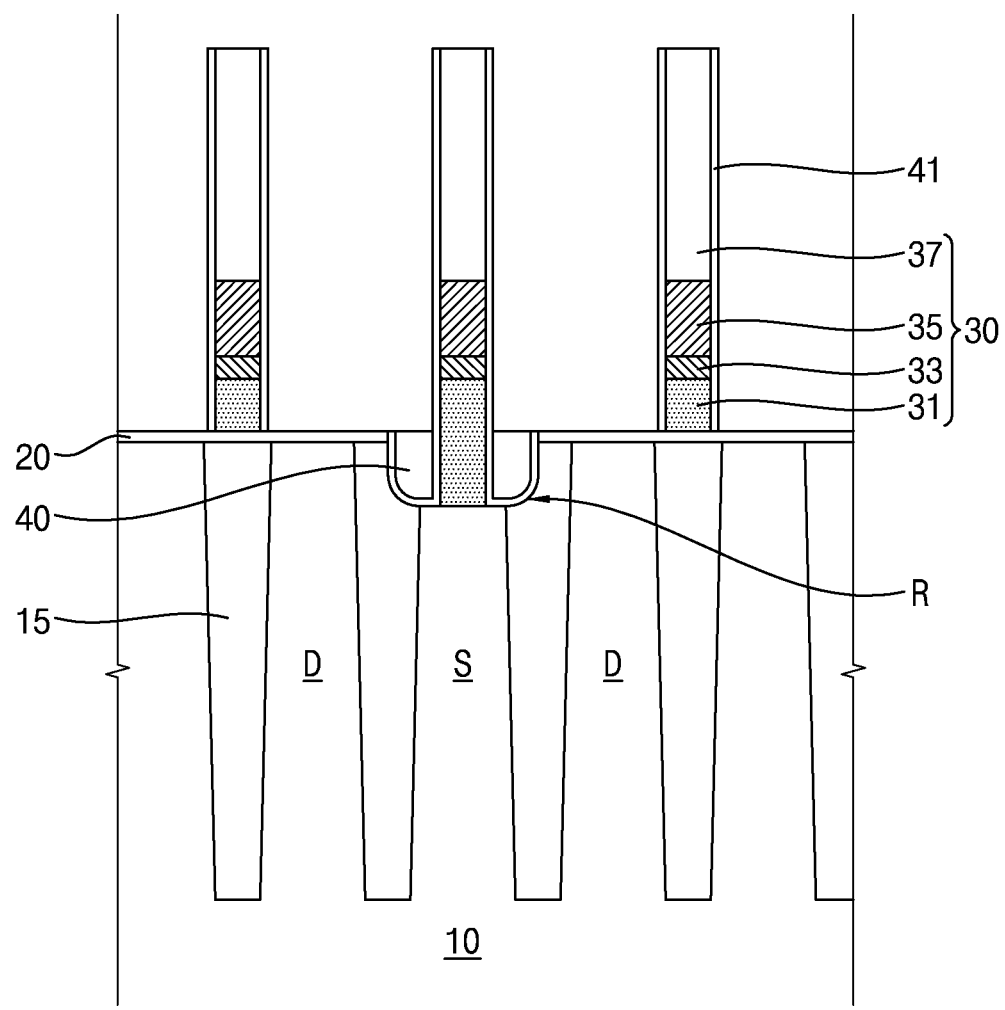

Referring to FIG. 5, the method may include forming an inner spacer 41 and a recess filler 40. The forming of the inner spacer 41 and the recess filler 40 may include conformally forming an inner spacer material layer on a surface of the bit line structure 30, an inner surface of the contact recess R, and a surface of the interlayer insulating layer 20, forming an insulator filling the contact recess R, and performing an etch-back process. The inner spacer 41 may be conformally formed on sidewalls of the bit line structure 30 and the inner surface of the contact recess R. The recess filler 40 may be formed to fill the contact recess R and be coplanar with the interlayer insulating layer 20. For example, the inner spacer 41 may include silicon nitride, and the recess filler 40 may include silicon oxide, silicon nitride, or at least one of various other insulating materials. In one embodiment, the inner spacer 41 may include silicon oxide. In one embodiment, the inner spacer 41 may include multiple layers of insulating materials. In one embodiment, a barrier material layer may be interposed between the bit line structure 30 and the inner spacer 41. In one embodiment, the inner spacer 41 may not be formed on the top surface of the bit line capping layer 37.

Figure 6:
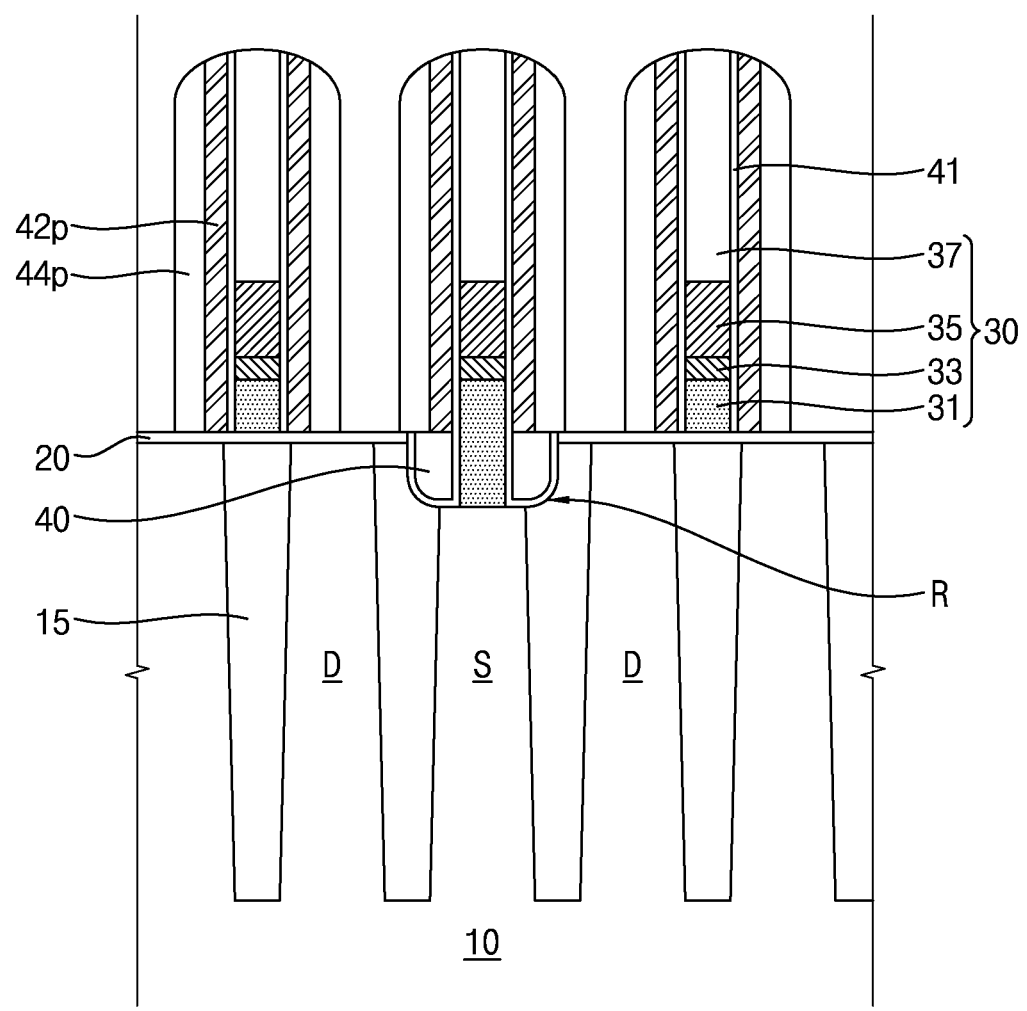

Referring to FIG. 6, the method may include forming a preliminary sacrificial spacer 42p and a preliminary outer spacer 44p. The forming of the preliminary sacrificial spacer 42p and the preliminary outer spacer 44p may include conformally entirely forming a sacrificial spacer material layer and an outer spacer material layer, and performing an anisotropic etch-back process to form a sacrificial spacer material layer and an outer spacer material layer on the outer surface of the inner spacer 41. For example, the preliminary sacrificial spacer 42p may be formed on the exposed outer surface of the inner spacer 41, and the preliminary outer spacer 44p may be formed on the outer surface of the preliminary sacrificial spacer 42p. The preliminary sacrificial spacer 42p may have etching selectivity with respect to the inner spacer 41 and the preliminary outer spacer 44p. For example, the preliminary sacrificial spacer 42p may include silicon oxide, and the inner spacer 41 and the preliminary outer spacer 44p may include silicon nitride.

Figure 7:
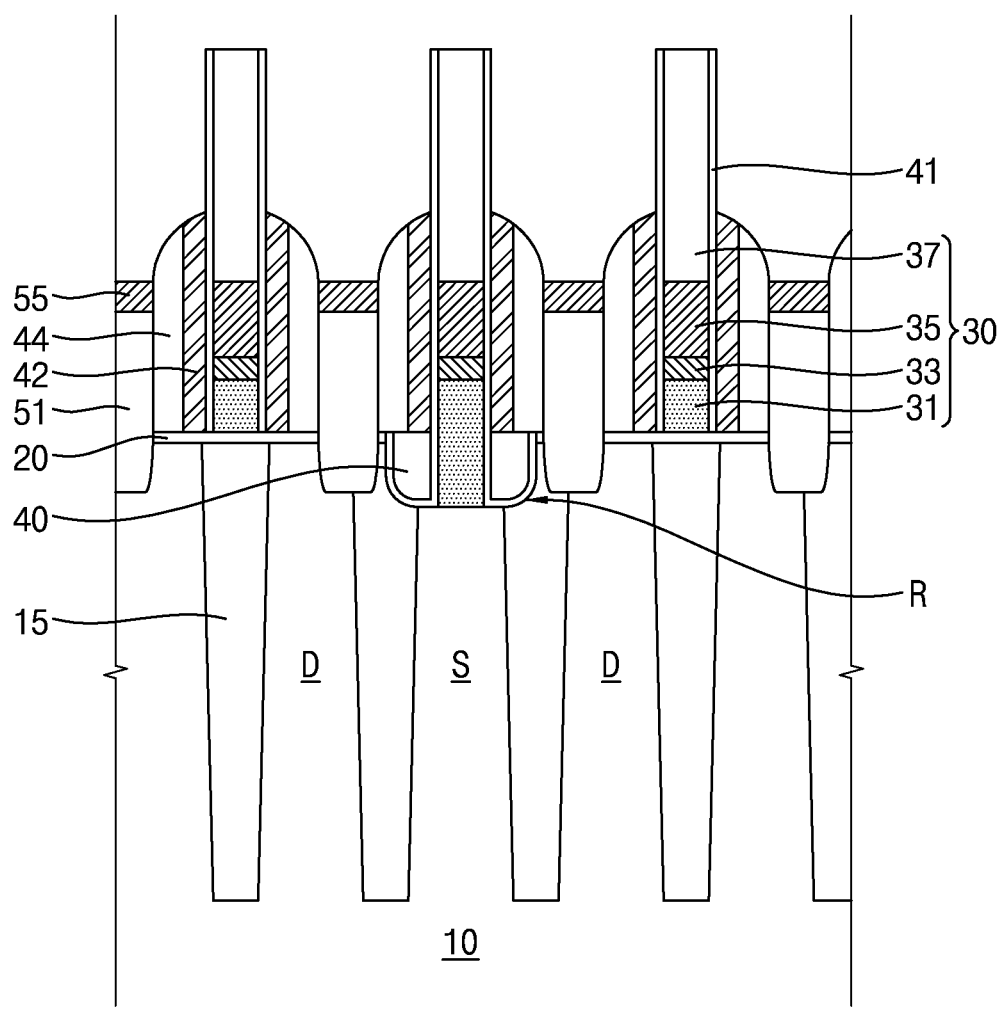

Referring to FIG. 7, the method may include forming a storage contact 51, a contact buffer layer 55, a sacrificial spacer 42, and an outer spacer 44. The forming of the storage contact 51 may include recessing the surface of the substrate 10 exposed between the preliminary outer spacers 44p, entirely forming a storage contact material layer, and recessing a top surface of the storage contact material layer using an etch-back process. Upper portions of the preliminary sacrificial spacer 42p and the preliminary outer spacer 44p may be partially removed so that the sacrificial spacer 42 and the outer spacer 44 may be formed. The sacrificial spacers 42 and the outer spacers 44 may expose outer surfaces of the inner spacers 41 formed on sidewalls of the bit line capping layer 37. For example, the upper portions of the sacrificial spacer 42 and the outer spacer 44 may be disposed at a middle level of the bit line structure 30. The contact buffer layer 55 may include a metal silicide layer. Top ends of the sacrificial spacers 42 and the outer spacers 44 may be disposed at a level higher than the top surface of the contact buffer layer 55. The upper surface of the sacrificial spacers 42 may be exposed.

Figure 8:
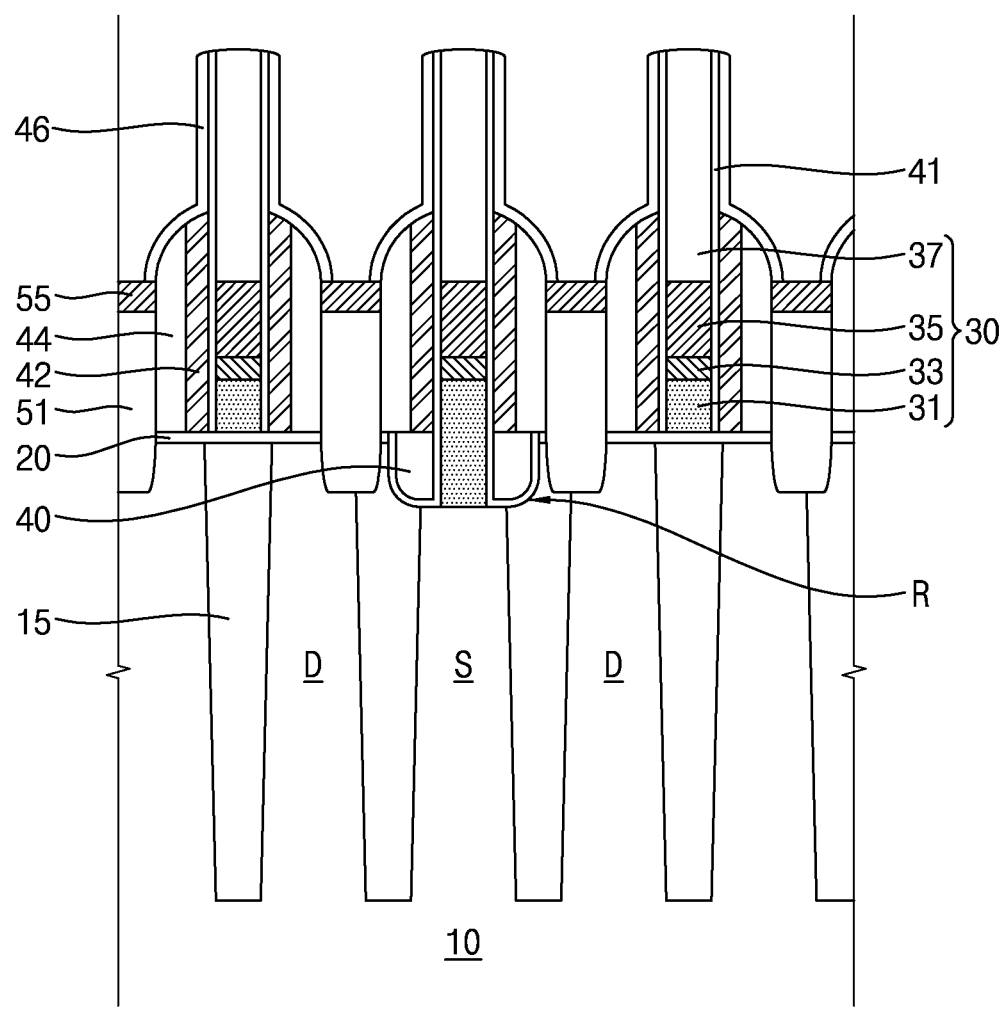

Referring to FIG. 8, the method may include forming a capping spacer 46. The forming of the capping spacer 46 may include entirely forming a capping spacer material layer, and performing an etch-back process to form the capping spacer 46. The capping spacer 46 may cover the exposed outer surface of the inner spacer 41, the exposed upper surface of the sacrificial spacer 42, and the exposed surface of the outer spacer 44.

Figure 9:
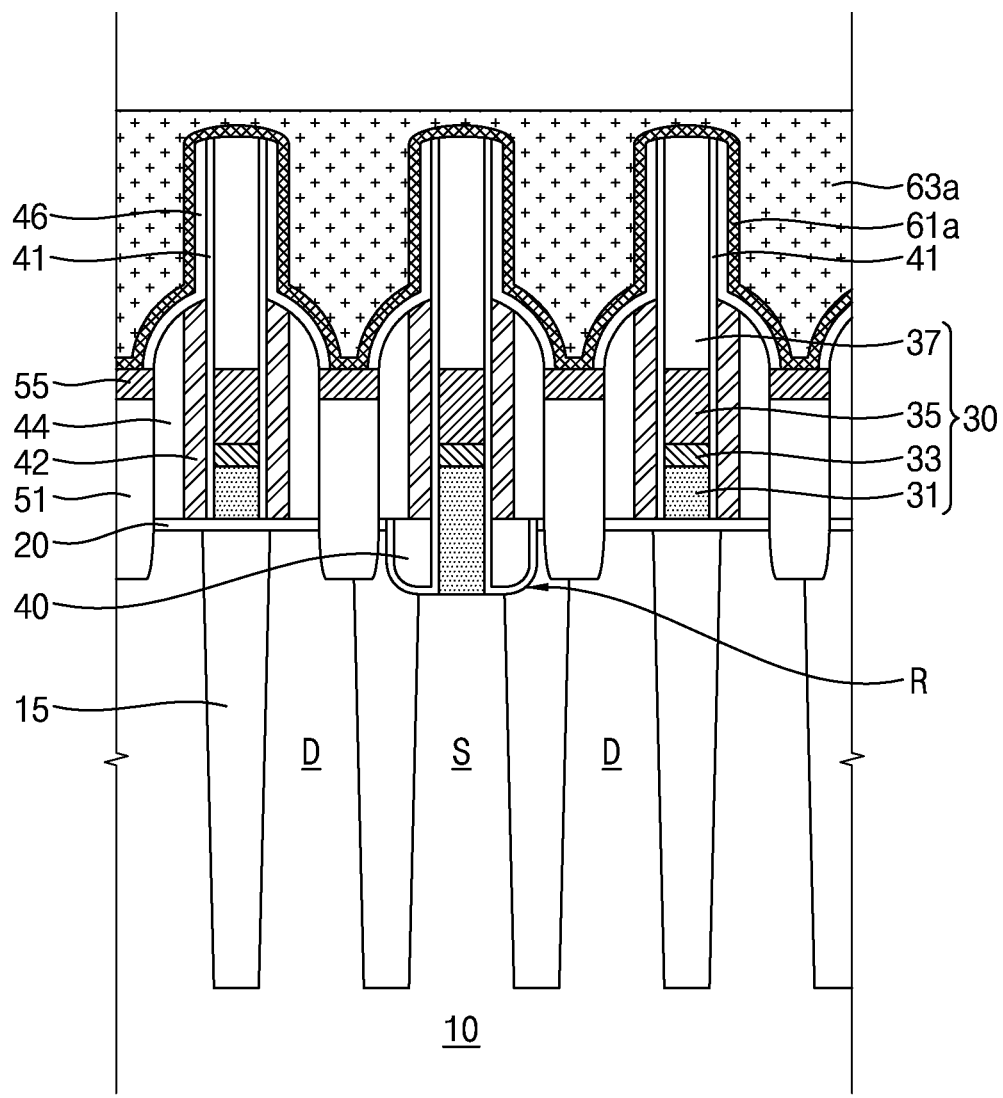

Referring to FIG. 9, the method may include forming a landing pad barrier material layer 61a and a landing pad material layer 63a on the resulting structure of FIG. 8. The forming of the landing pad barrier material layer 61a may include conformally forming a barrier metal such as titanium nitride on the resulting structure of FIG. 8. The forming the landing pad material layer 63a may include forming a conductive material to completely fill the space between the bit line structures 30. For example, the landing pad material layer 63a may include metal such as tungsten.

Figure 10:
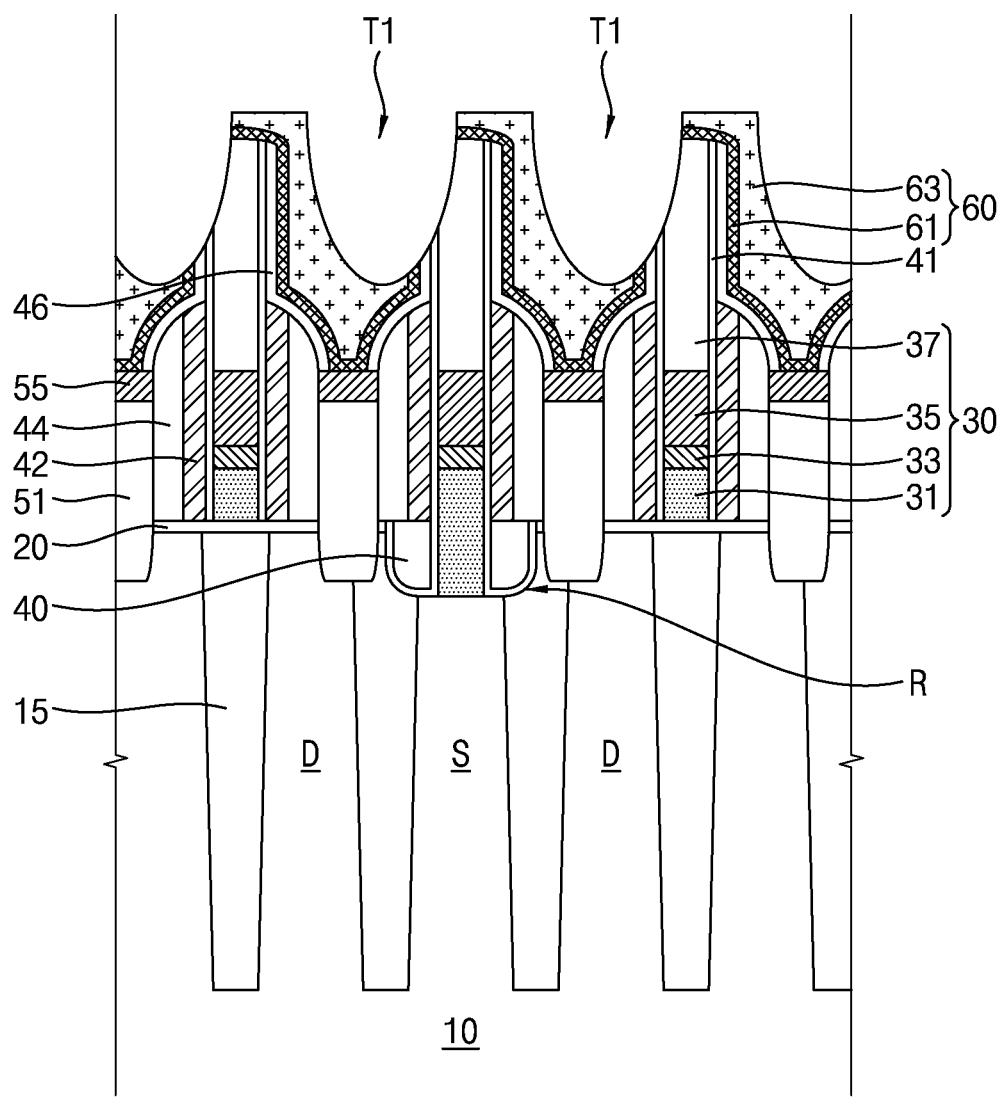

Referring to FIG. 10, the method may include performing a first etching process to form a pad isolation trench T1 to form landing pad structures 60. Each of the landing pad structures 60 may include a landing pad barrier layer 61 and a landing pad 63. The landing pad structures 60 may be physically separated and electrically insulated from each other. Referring to FIG. 1, the pad isolation trench T1 may include a trench shape that defines landing pads LP.

Figure 11:
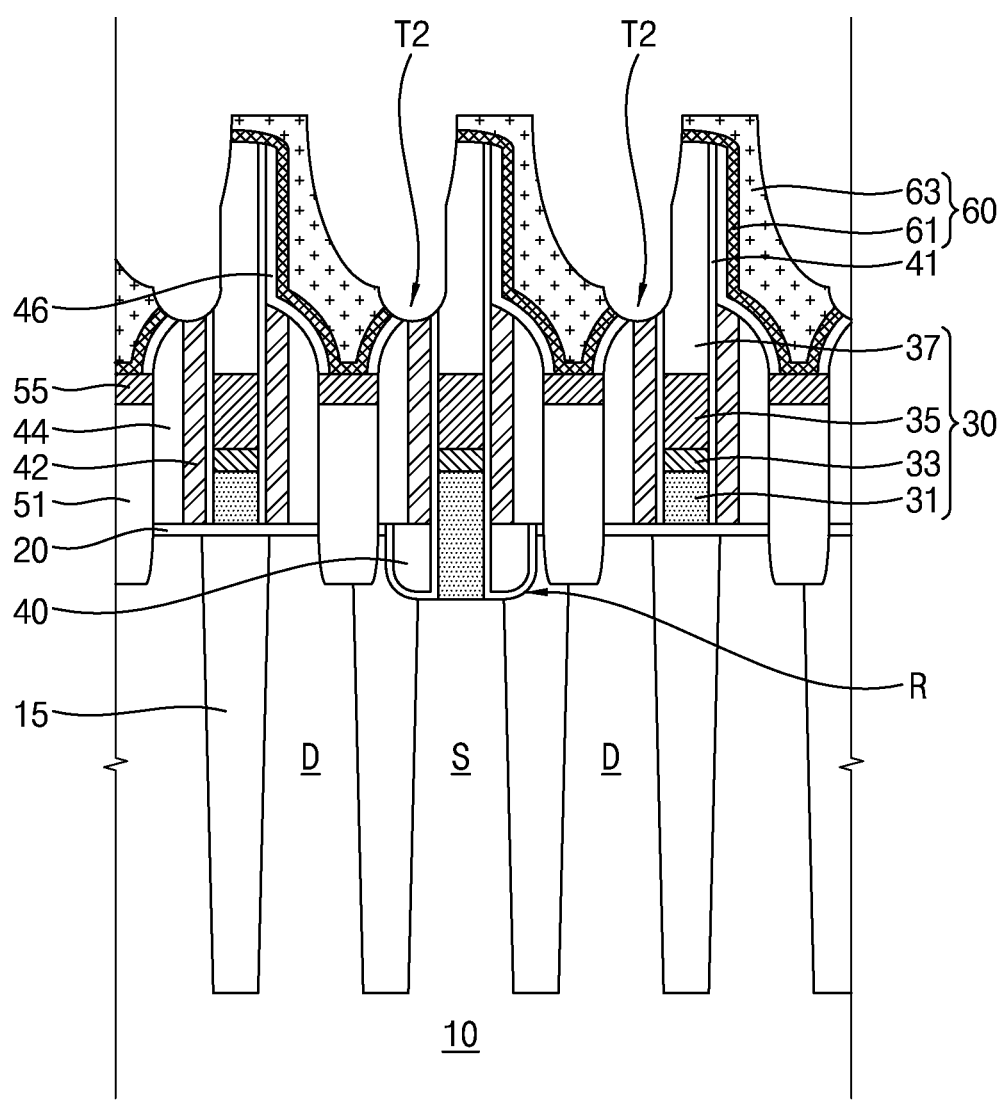

Referring to FIG. 11, the method may include forming a recess trench T2 that exposes a top portion of the sacrificial spacer 42 by performing a second etching process. The second etching process may have a higher anisotropic etching characteristic than the first etching process. The recess trench T2 may be formed by recessing a portion of the lower portion of the pad isolation trench T1 to be recessed. The recess trench T2 may also have a trench shape.

Figure 12:
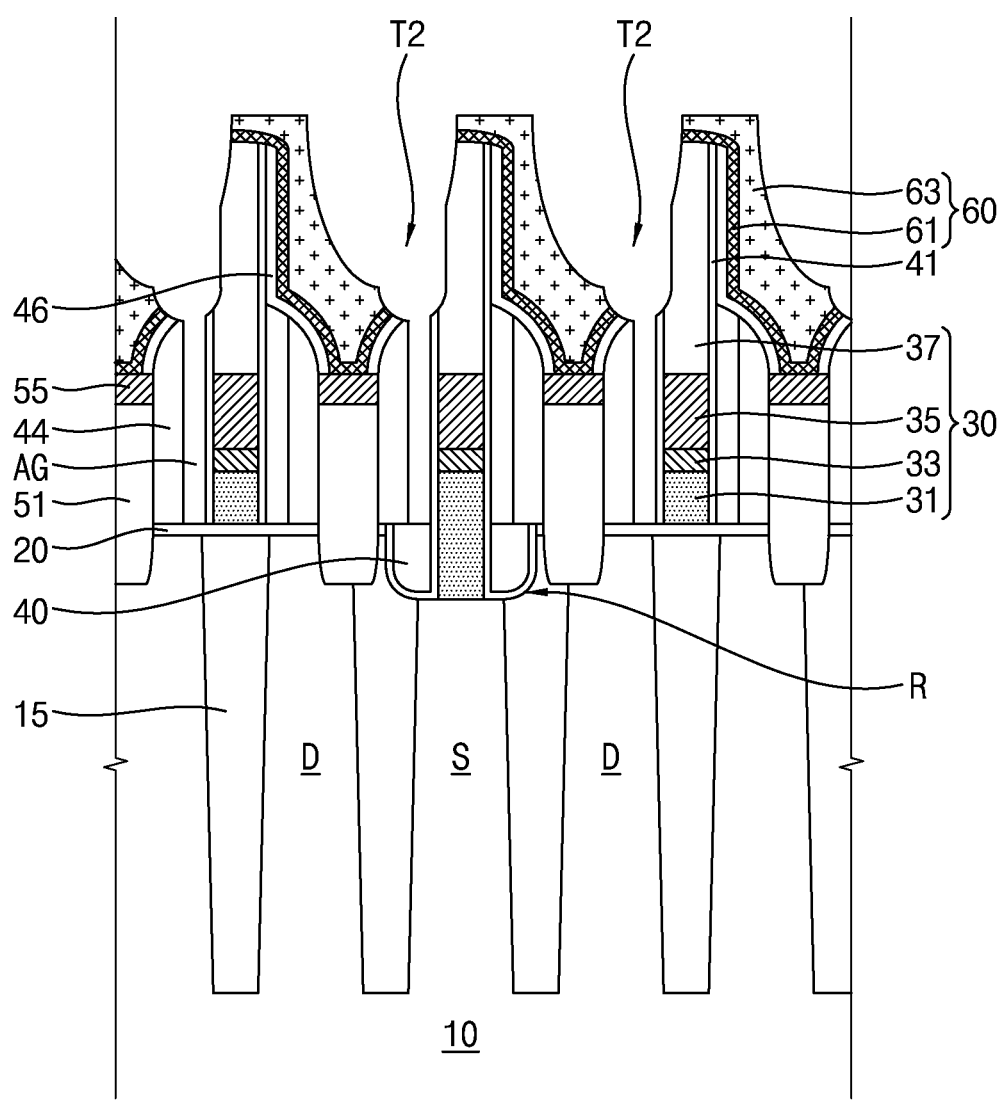

Referring to FIG. 12, the method may include removing the sacrificial spacer 42 through the recess trench T2. An air gap AG may be formed by removing the sacrificial spacer 42. The air gap AG may be disposed between the bit line structure 30 and the storage contact 51. Accordingly, the air gap AG may reduce the parasitic capacitance between the bit line structure 30 and the storage contact 51 to reduce the RC delay of electrical signals transmitted via the bit line structure 30, for example.

Figure 13A:
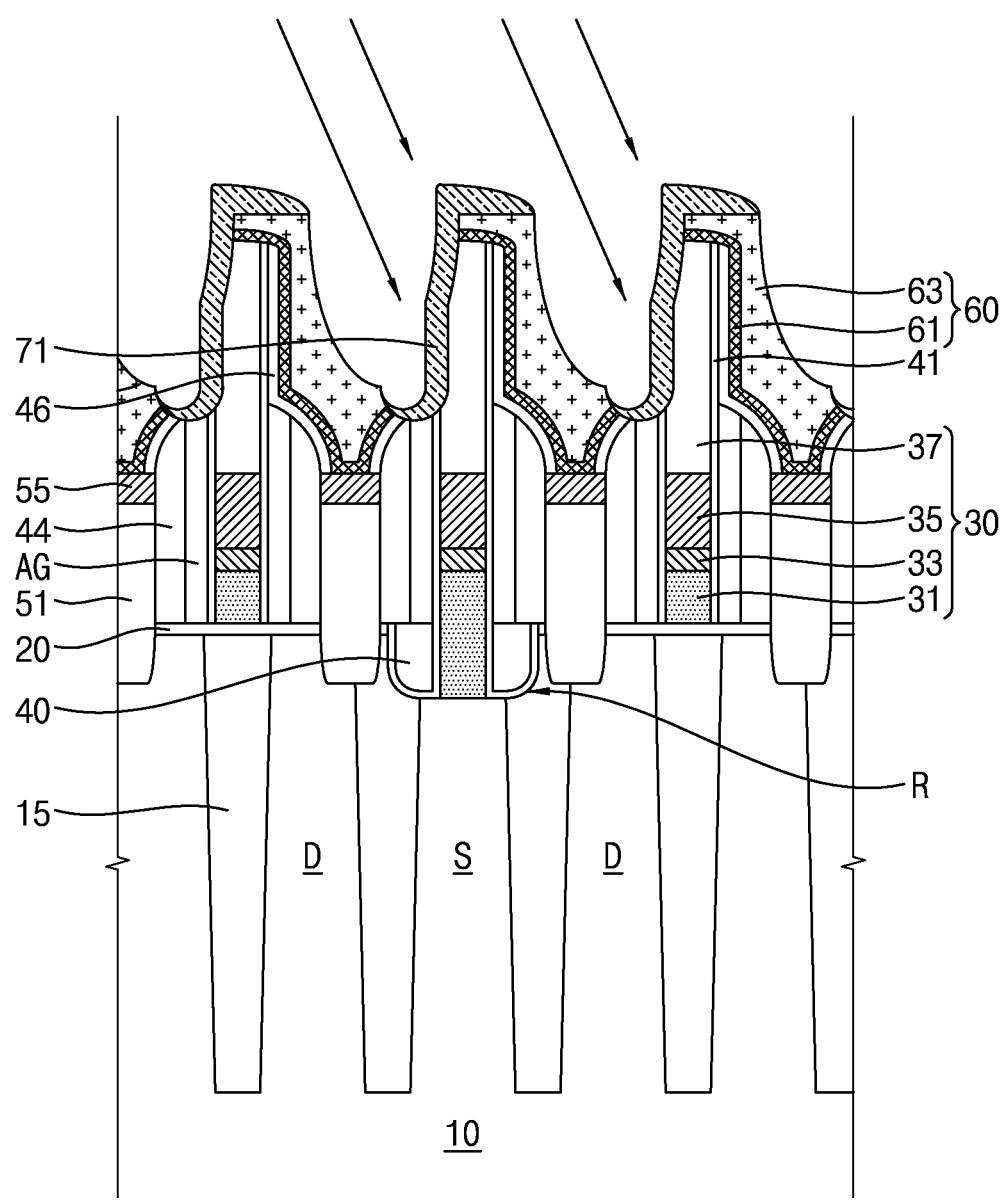
Figure 13B:
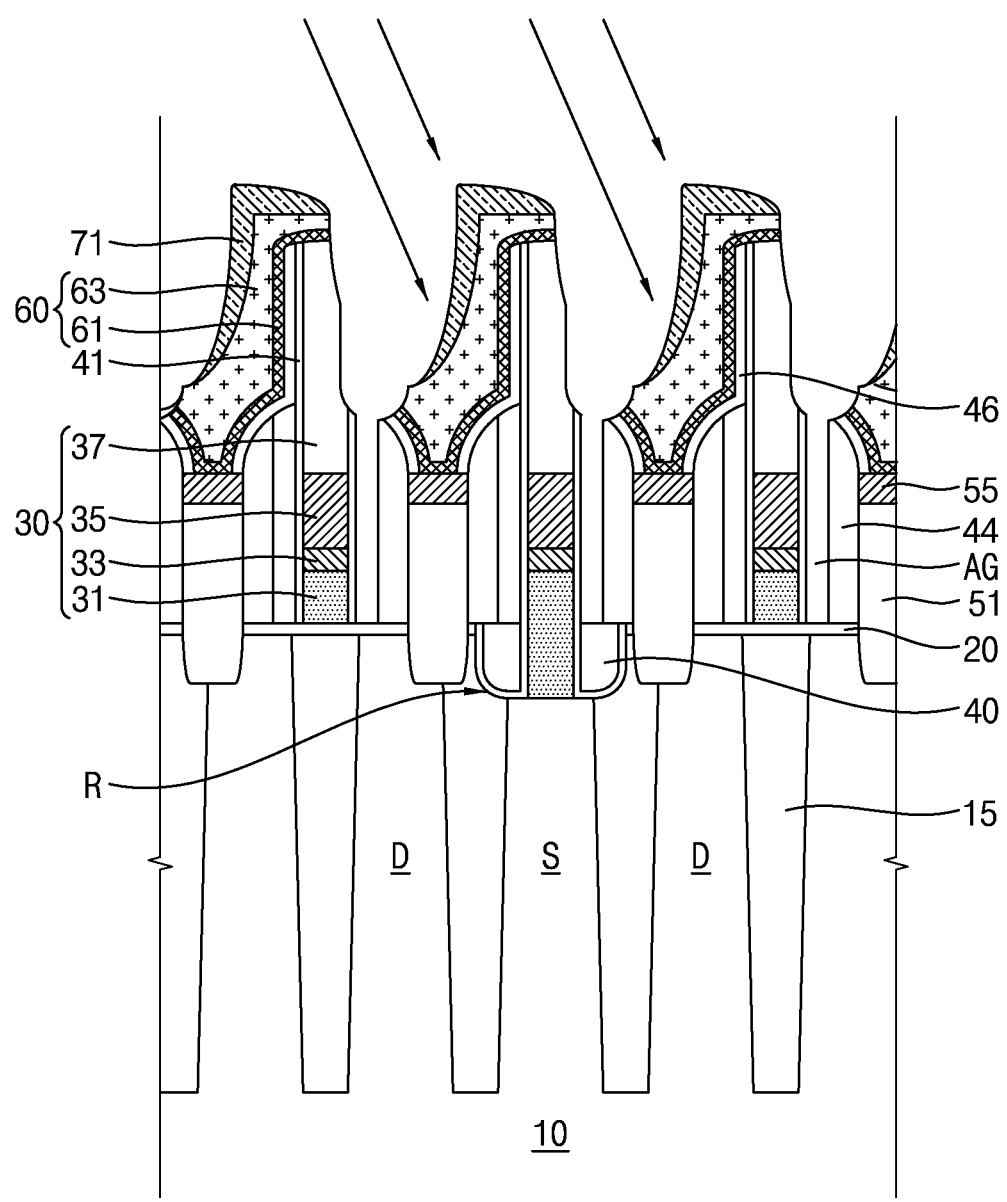

Referring to FIGS. 13A and 13B, the method may include performing a first directional deposition process to form a first sealing layer 71 on first sidewalls of the pad isolation trench T1 and the recess trench T2 in a first diagonal direction. Referring to FIG. 13A, the first sealing layer 71 may seal a top of the air gap AG exposed in the first diagonal direction. Referring to FIG. 13B, the first sealing layer 71 may be formed on the first sidewalls of the pad isolation trench T1 where the recess trench T2 and the air gap AG are not exposed. The first directional deposition process may be performed using an ionic deposition process using ions and a radical deposition process using radicals. For example, the ionic deposition process may include depositing ions to be deposited in a diagonal direction with reference to an upper surface of the substrate 10. The radical deposition process may include depositing a material in a vertical direction using plasma. The radical deposition process may further include etching the material in the vertical direction. The ionic deposition process and the radical deposition process may be performed sequentially, alternately, or simultaneously. For example, the ionic deposition process and/or the radical deposition process may use plasma (including ions and radicals) generated using DC power or RF power. The ionic deposition process and/or the radical deposition process may have various acceleration energy distributions for the deposition thickness. The ionic deposition process and/or the radical deposition process may use at least one of a silicon source gas such as $SiCl_2H_3$, $SiH_4$, $Si_2Cl_6$, an oxygen source gas such as $O_2$ or $H_2O$, a nitrogen source gas such as $NH_3$ or $N_2$, a carbon source gas such as $C_2H_4$, a boron source gas such as $B_2H_6$ or $BCl_3$, and combinations thereof. The ionic deposition process and/or the radical deposition process may be performed within a temperature range between a room temperature and about 700° C. The ionic deposition process and/or the radical deposition process may be performed in a vacuum of about 10E-8 Pa. The ionic deposition process may deposit ions at various oblique angles as needed.

Figure 14A:
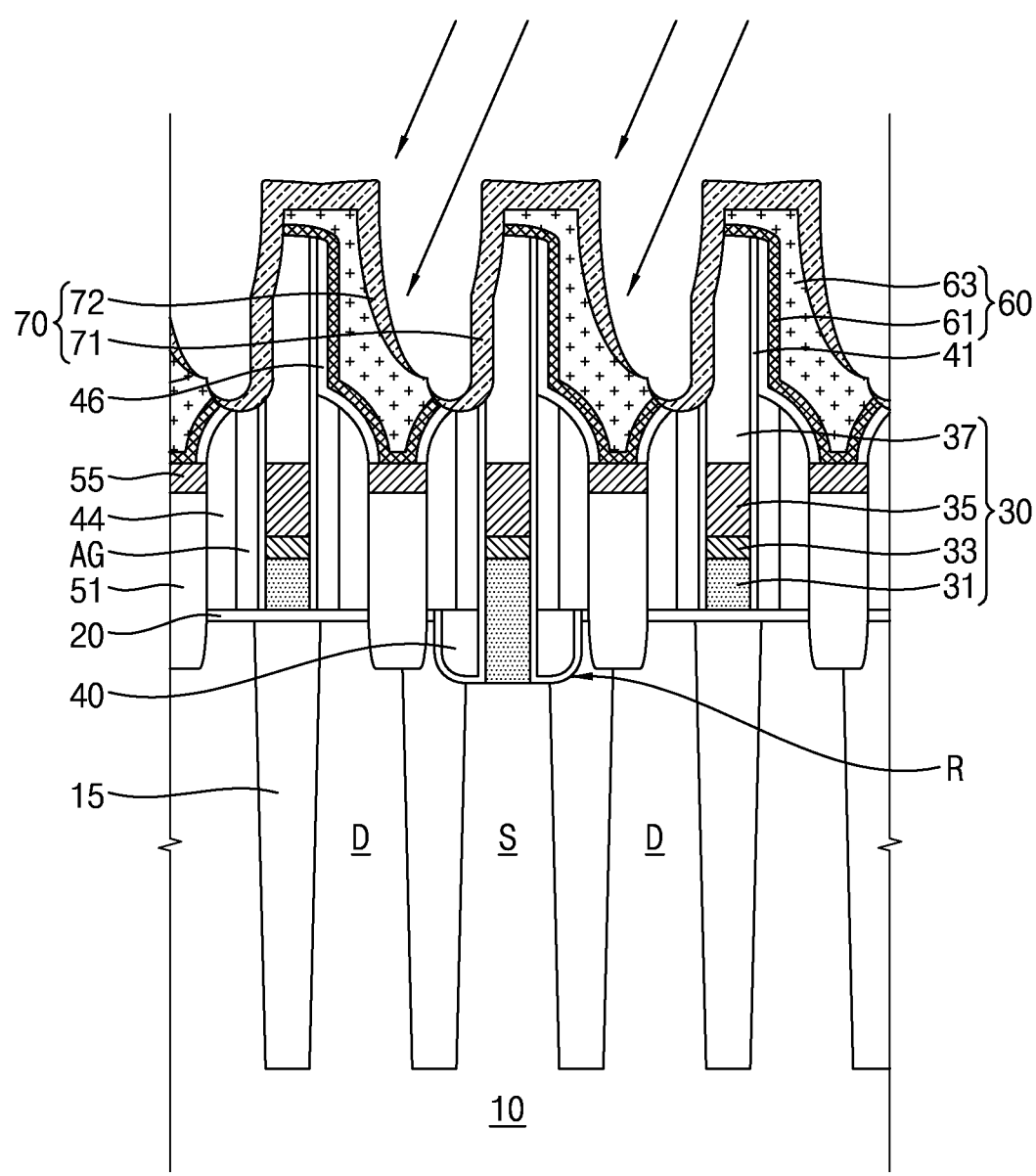
Figure 14B:
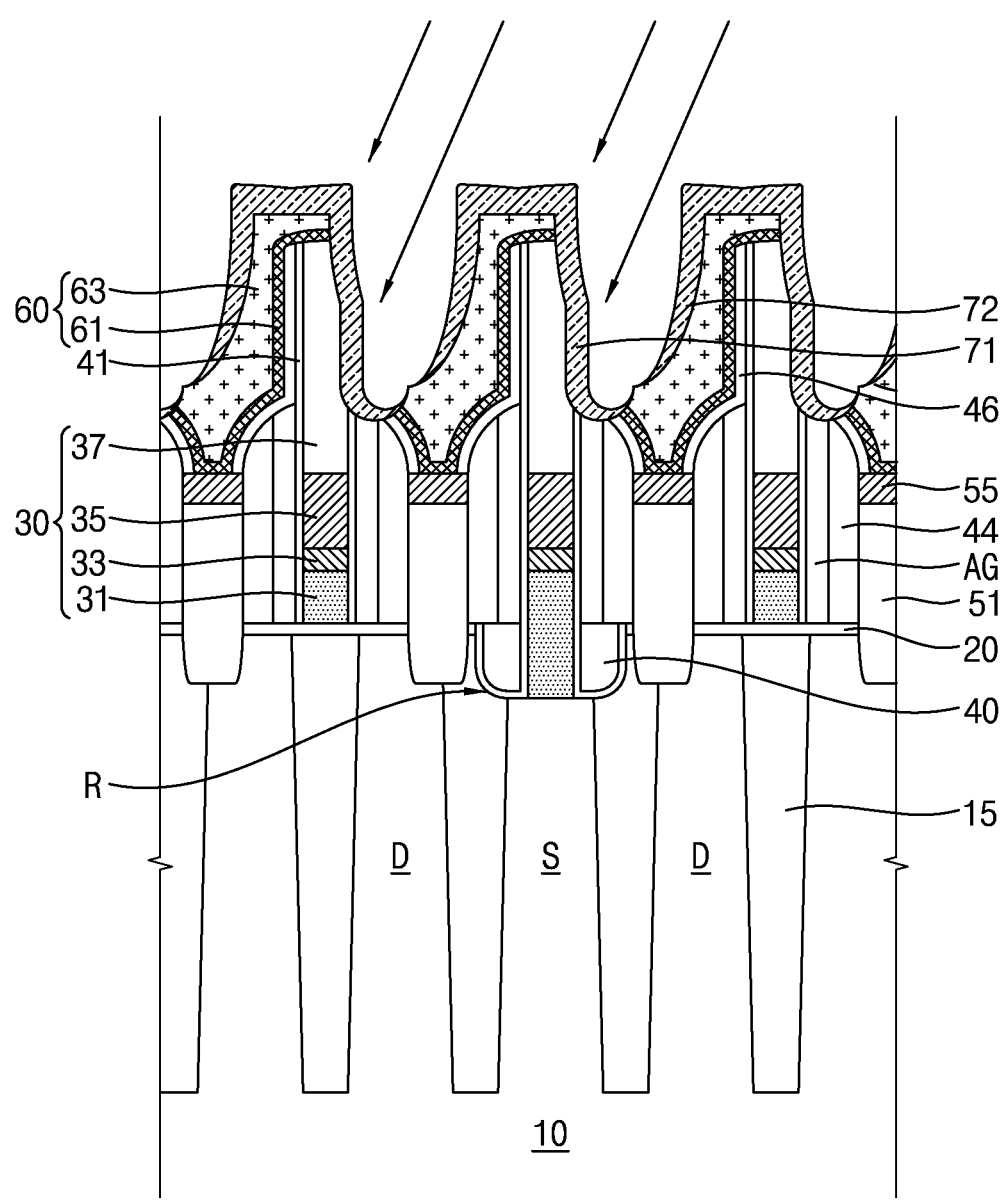

Referring to FIGS. 14A and 14B, the method may include forming a second sealing layer 72 on second sidewalls of the pad isolation trench T1 and the recess trench T2 by performing a second directional deposition process. Referring to FIG. 14A, the second sealing layer 72 may be formed on the second sidewall of the pad isolation trench T1 in which the recess trench T2 and the air gap AG are not exposed. Referring to FIG. 14B, the second sealing layer 72 may seal the top portion of the air gap AG exposed in the second diagonal direction.

Figure 15:
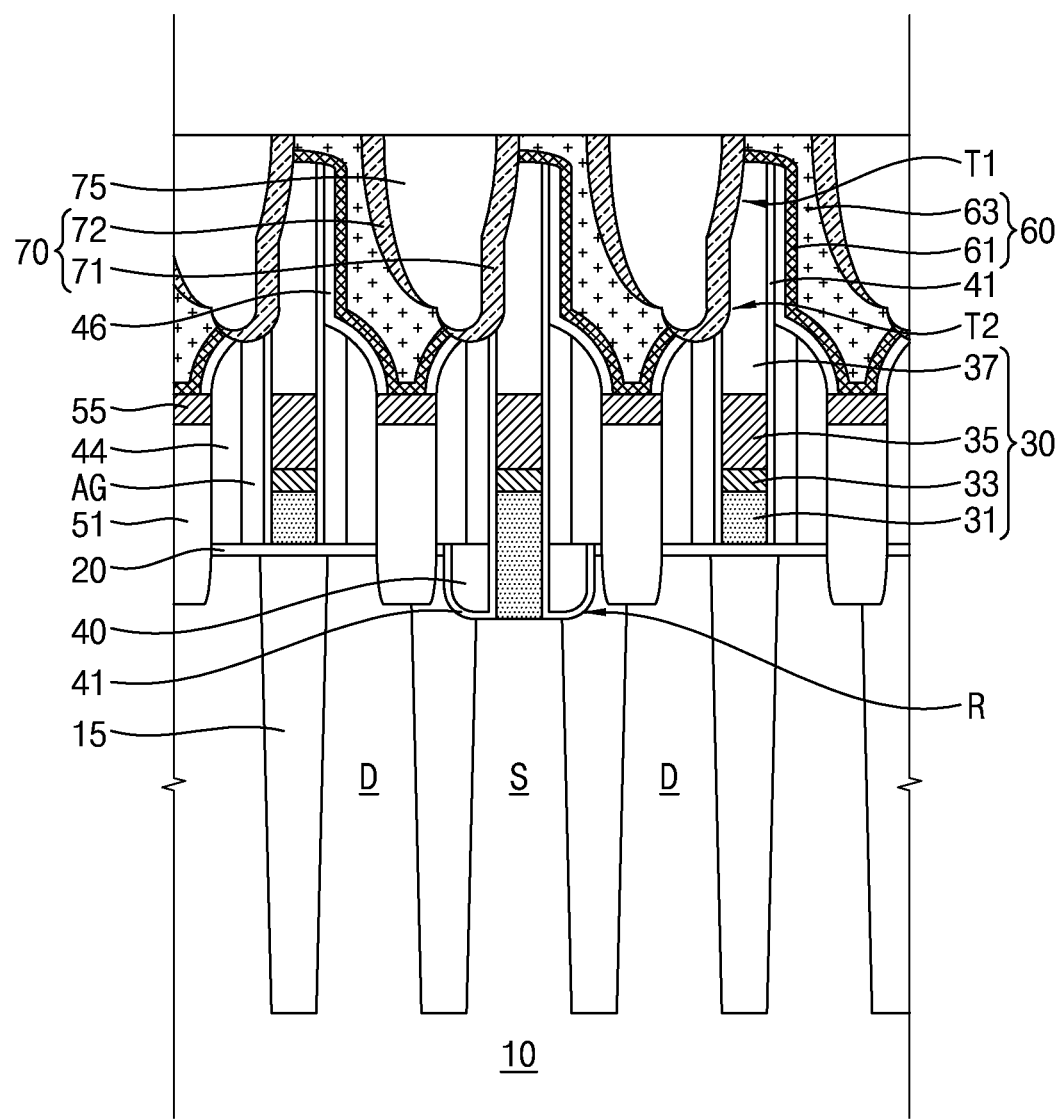

Referring to FIG. 15, the method may include forming an insulator in the pad isolation trench T1 and the recess trench T2 to form a pad isolation insulator 75. The forming of the pad isolation insulator 75 may include entirely forming, on the resulting structure of FIG. 14A, for example, the insulator such as silicon nitride and performing a planarization process such as CMP (chemical mechanical polishing).

Subsequently, referring to FIG. 2A, the method may include forming a storage structure 80 including a lower storage electrode 81, a storage dielectric layer 83, and an upper storage electrode 85. The lower storage electrode 81 may include a conductive material such as metal. The storage dielectric layer 83 may include at least one of hafnium oxide, zirconium oxide, tantalum oxide, or other high-k dielectric materials. The upper storage electrode 85 may include a conductive material such as metal.

FIGS. 16 to 23 are longitudinal cross-sectional views illustrating a method of forming the DRAM device 100B in accordance with an exemplary embodiment of the present disclosure illustrated in FIG. 2B.

Figure 16:
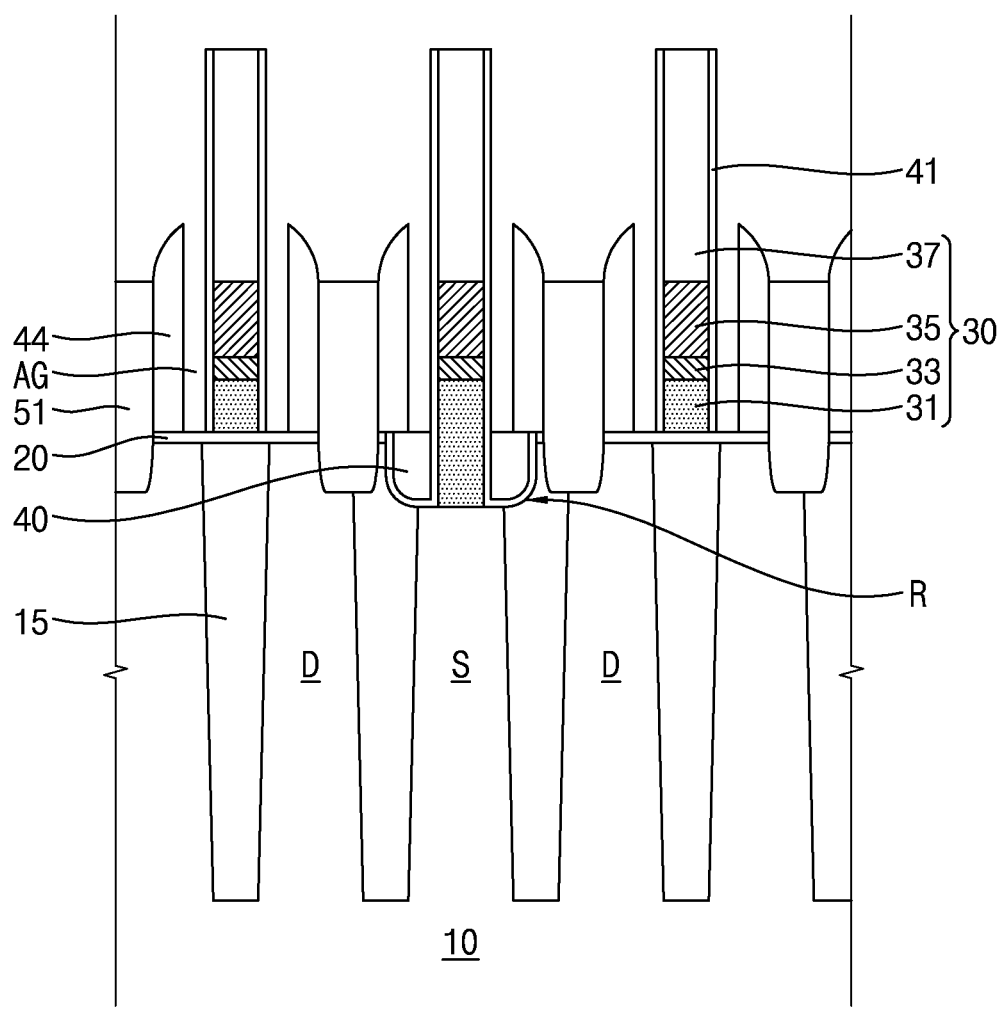
FIGS. 16 to 18, 19A and 19B, and 20 to 23 are longitudinal cross-sectional views illustrating a method of forming the DRAM device in accordance with an exemplary embodiment of the present disclosure illustrated in FIG. 2B.

Referring to FIG. 16, a method of forming the DRAM device 100B may include performing the processes described with reference to FIGS. 3 to 7 to form isolation regions 15 defining a source region S and a drain regions D in a substrate 10, an interlayer insulating layer 20, a contact recess R, a bit line structure 30, an inner spacer 41, a sacrificial spacer 42, an outer spacer 44, a storage contact 51 and a contact buffer layer 55, and an air gap AG by removing the sacrificial spacer 42.

Figure 17:
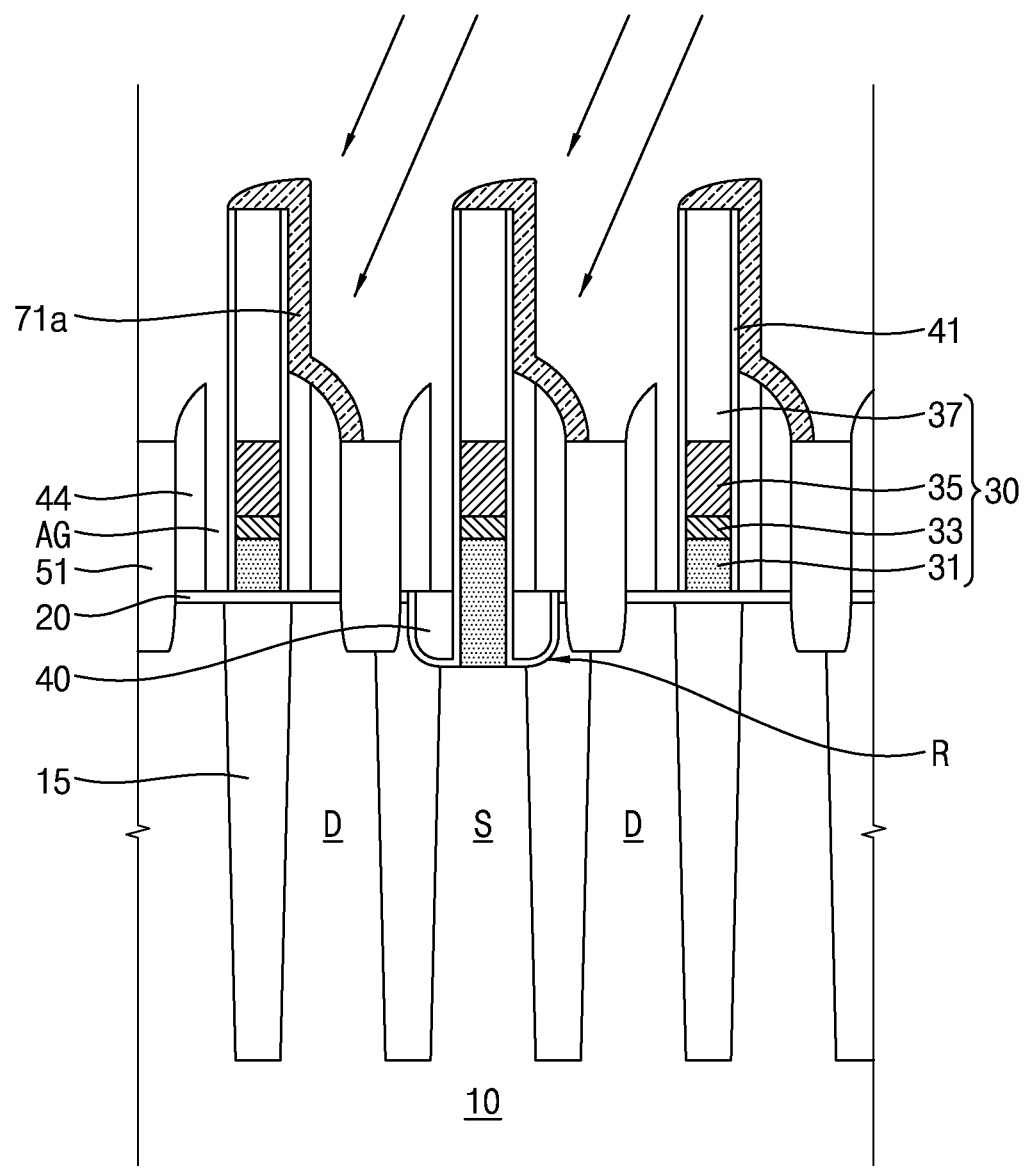

Referring to FIG. 17, the method may include forming a first sealing material layer 71a by performing a first directional deposition process. The first sealing material layer 71a may be formed on a first surface, exposed in the first diagonal direction, of the resulting structure of FIG. 16. In an example embodiment, the exposed first surface of the resulting structure of FIG. 16 may include a top surface of the bit line structure 30, an outer surface of the inner spacer 41 positioned to the right of the bit line structure 30, an outer surface of the outer spacer 44 positioned to the right of the bit line structure 30, and a portion of a top surface the storage contact 51. The exposed first surface may vary depending on a geometry of the resulting structure of FIG. 16 (e.g., height of the bit line structure 30, spacing between two adjacent bit line structures 30). The first sealing material layer 71a may seal a top portion of the sacrificial spacer 42 exposed in the first diagonal direction.

Figure 18:
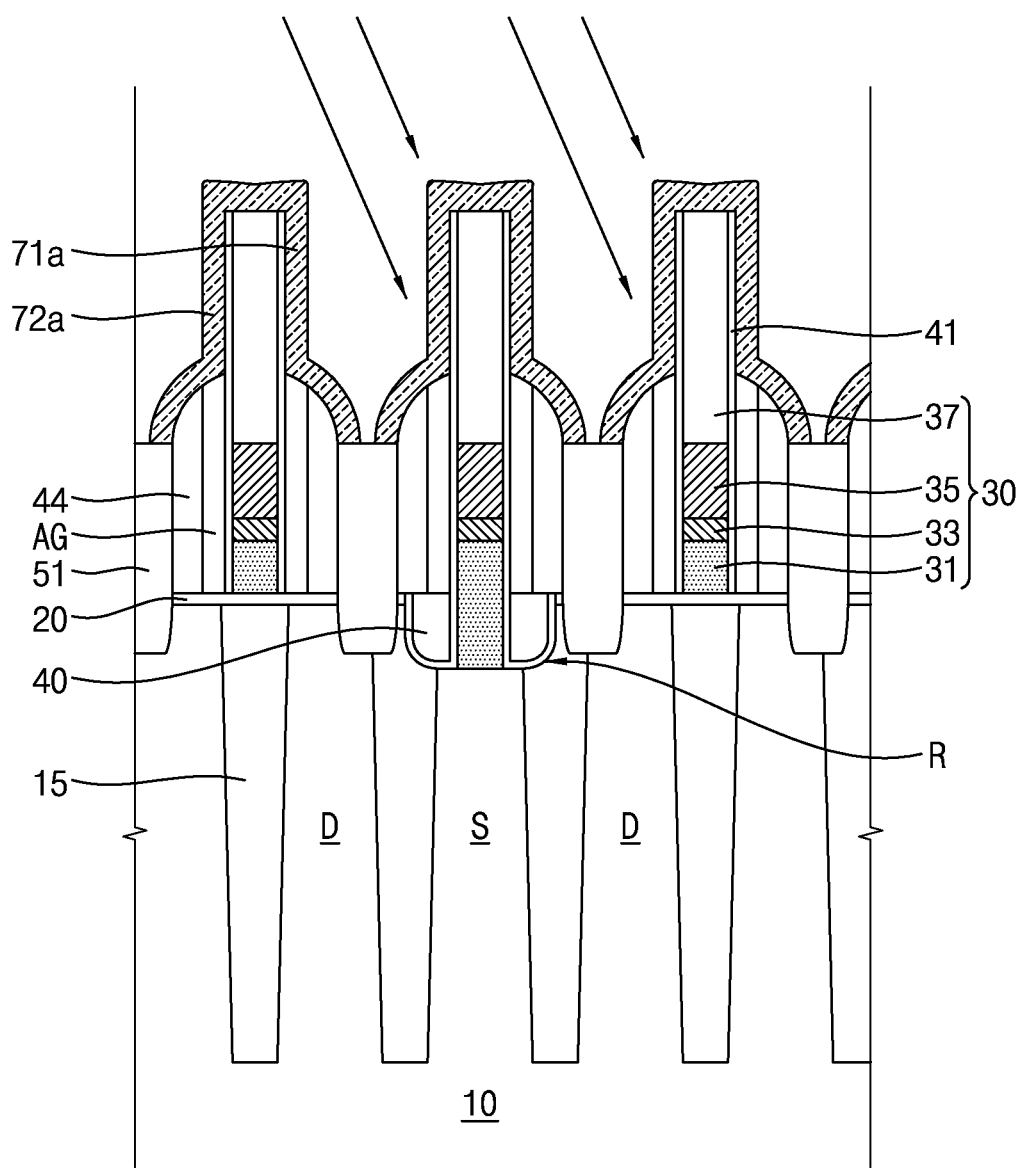

Referring to FIG. 18, the method may include forming a second sealing material layer 72a by performing a second directional deposition process. The second sealing material layer 72a may be formed on a second surface, exposed in the second diagonal direction, of the resulting structure of FIG. 16. In an example embodiment, the exposed second surface of the resulting structure of FIG. 16 may include the top surface of the bit line structure 30, the outer surface of the inner spacer 41 positioned to the left of the bit line structure 30, the outer surface of the outer spacer 44 positioned to the left of the bit line structure 30, and a portion of the top surface of the storage contact 51. The second sealing material layer 72a may seal a top portion of the sacrificial spacer 42 exposed in the second diagonal direction.

Figure 19A:
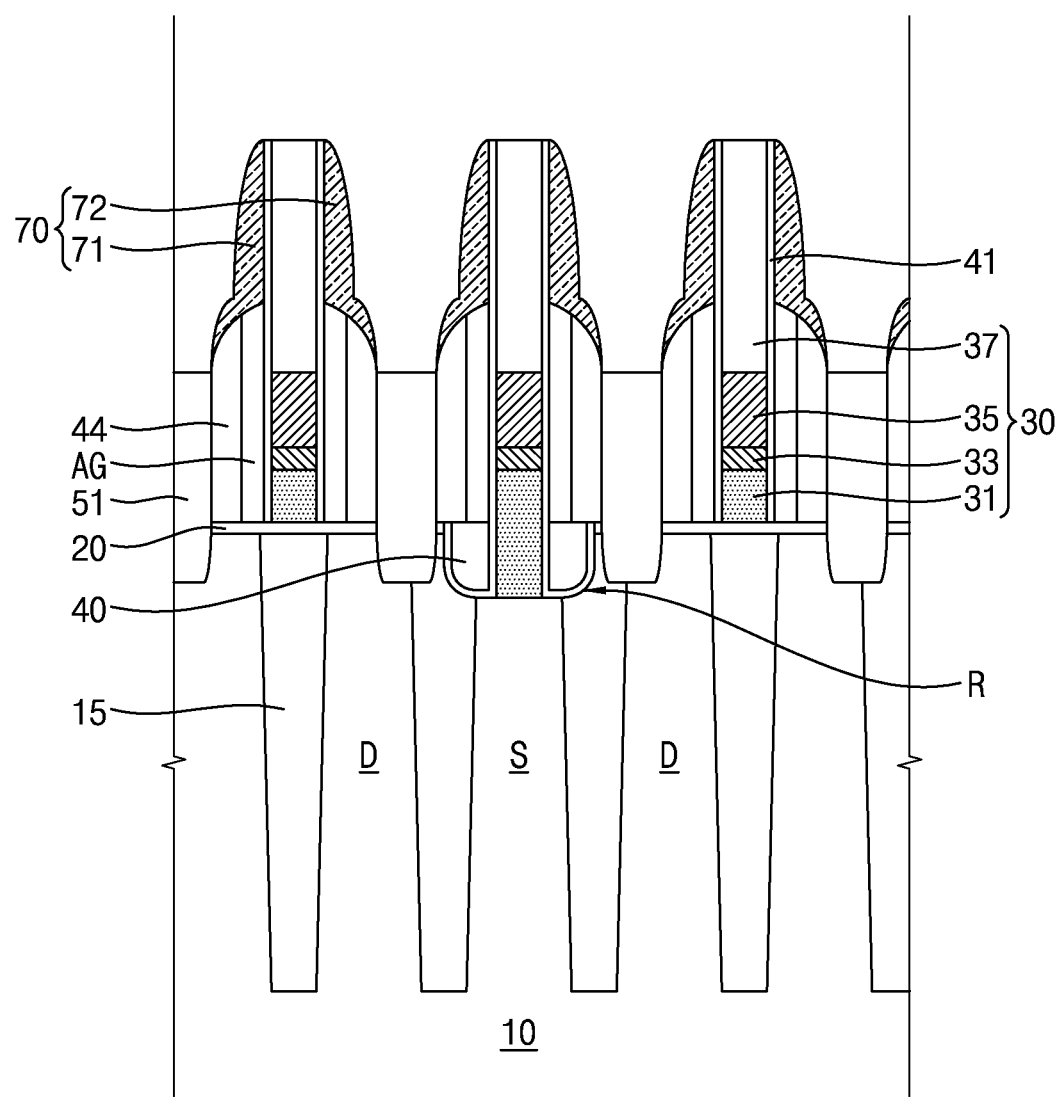

Referring to FIG. 19A, the method may include forming a sealing layer 70 by performing an anisotropic etch process. The sealing layer 70 may include a first sealing layer 71 and a second sealing layer 72. The first sealing material layer 71a and the second sealing material layer 72a on the top surface of the bit line structure 30 and the top surface of the storage contact 51 may be removed to form the first sealing layer 71 and the second sealing layer 72. The first sealing layer 71 may be formed on the outer surface of the bit line structure 30, the outer surface of the inner spacer 41, and the outer surface of the outer spacer 44 exposed in the first diagonal direction. The first sealing layer 71 may seal the top portion of the air gap AG exposed in the first diagonal direction. The second sealing layer 72 may be formed on the outer surface of the bit line structure 30 exposed in the second diagonal direction, the outer surface of the inner spacer 41, and the outer surface of the outer spacer 44. The second sealing layer 72 may seal the top portion of the air gap AG exposed in the second diagonal direction.

Figure 19B:
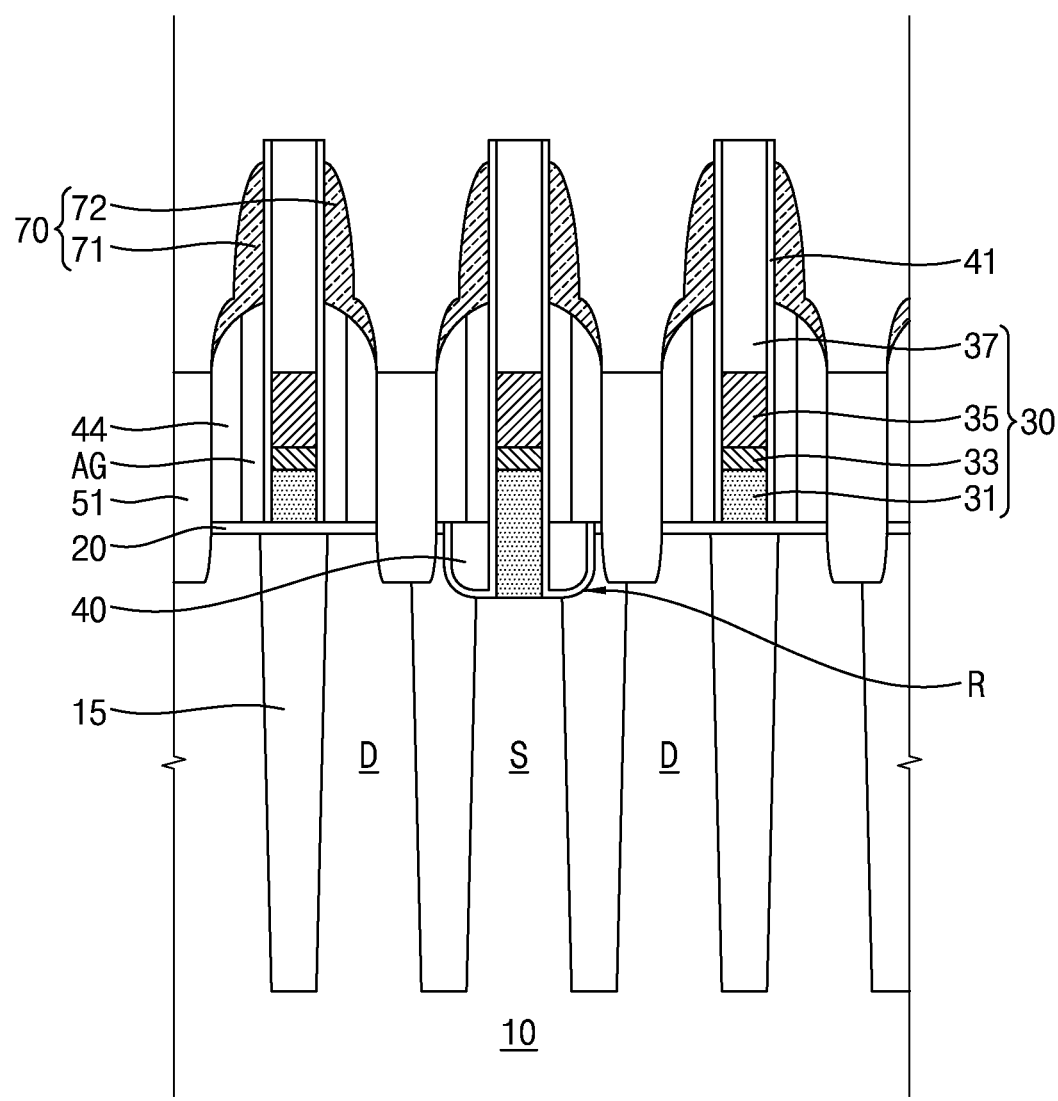

Referring to FIG. 19B, in one embodiment, the method may further include performing an anisotropic etch process to partially expose the upper portion of the inner spacer 41 by partially removing the sealing layer 70. This process may be omitted.

Figure 20:
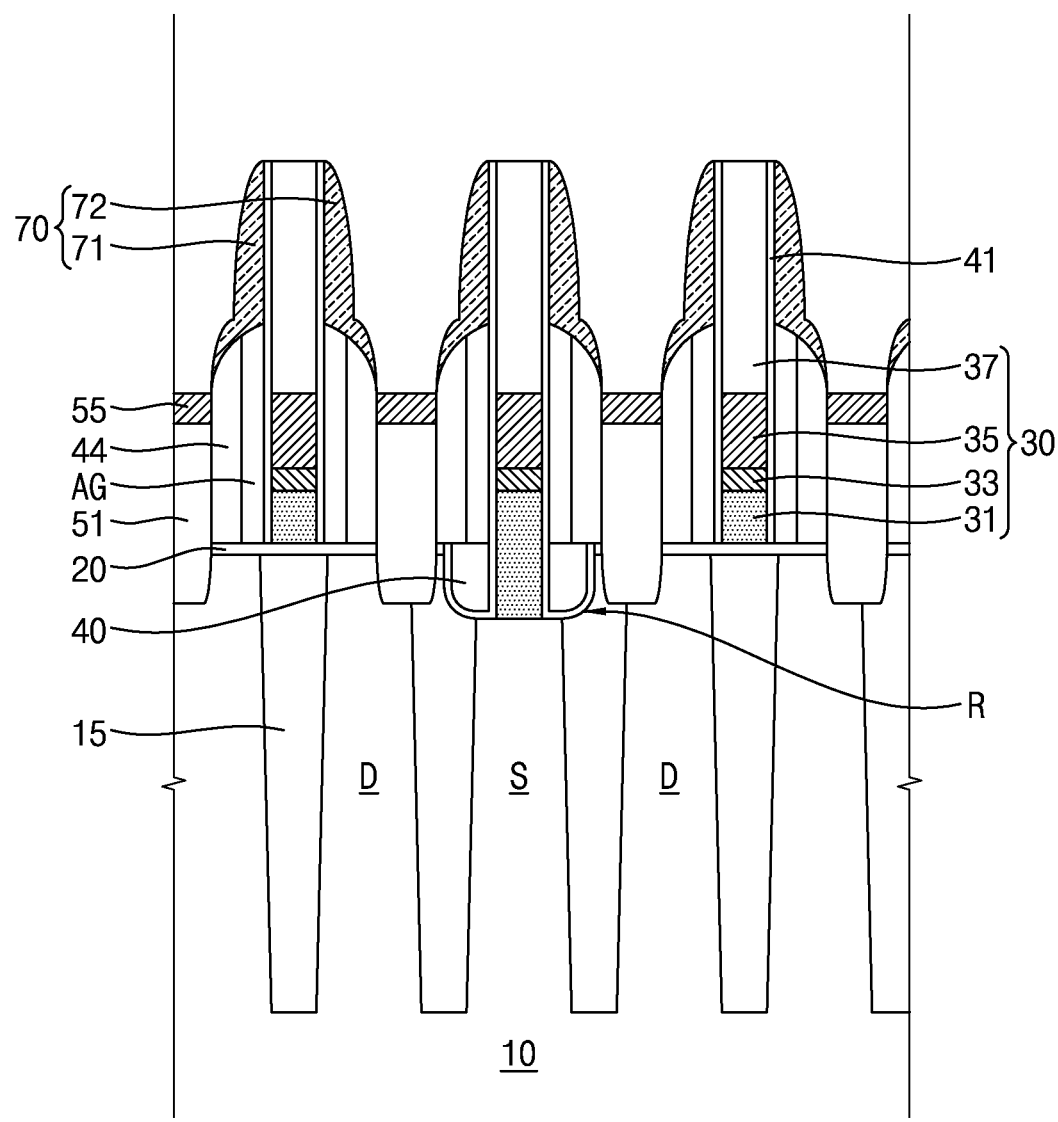

Referring to FIG. 20, the method may include forming a contact buffer layer 55 on the storage contact 51. The contact buffer layer 55 may include a silicide layer. For example, when the storage contact 51 includes silicon, the forming of the contact buffer layer 55 may include forming a metal layer on the storage contact 51 and causing a silicidation reaction between the storage contact 51 and the metal layer.

Figure 21:
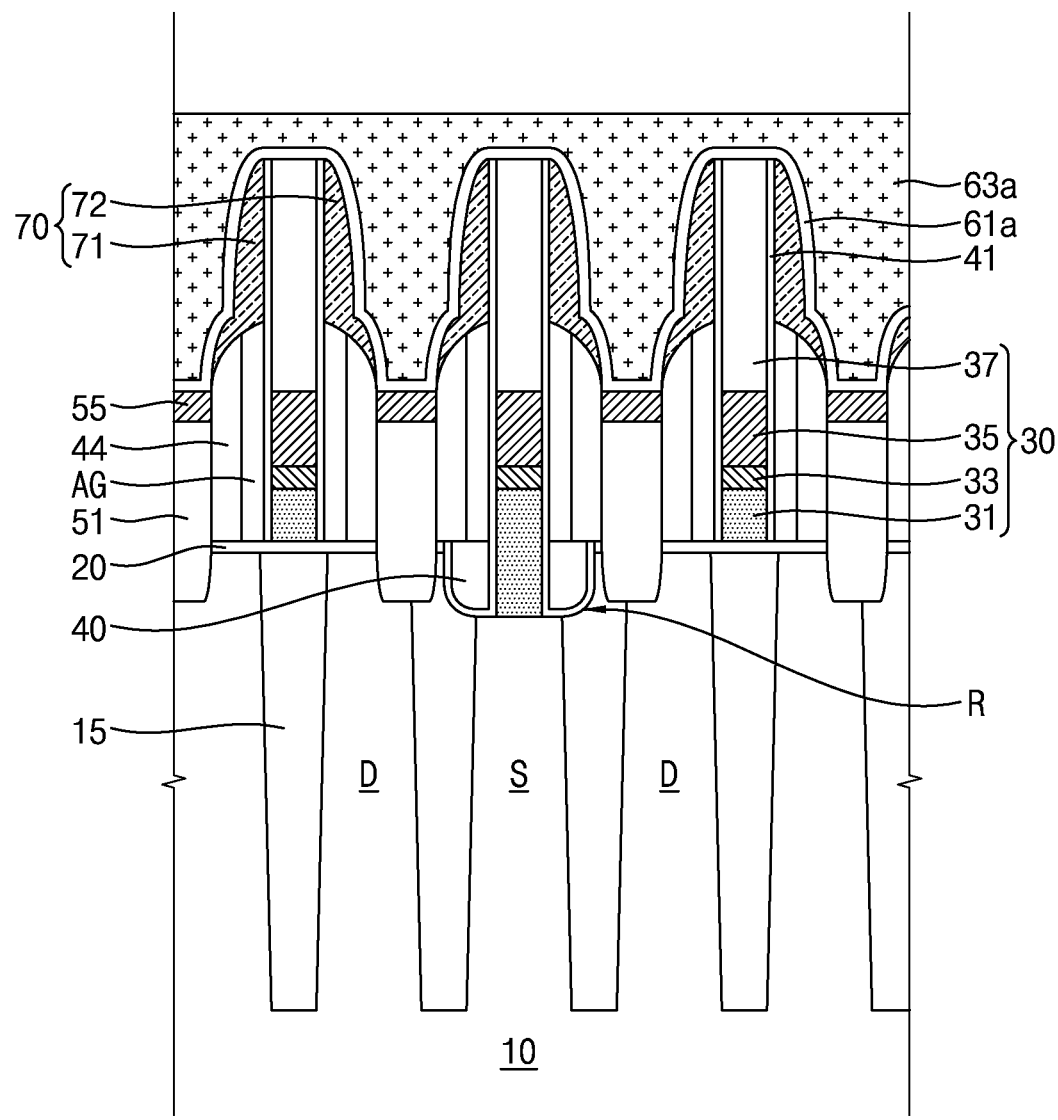

Referring to FIG. 21, the method may include forming a landing pad barrier material layer 61a and a landing pad material layer 63a. The landing pad barrier material layer 61a may be conformally formed. The forming the landing pad material layer 63a may include forming a conductive material to completely fill the space between the bit line structures 30.

Figure 22:
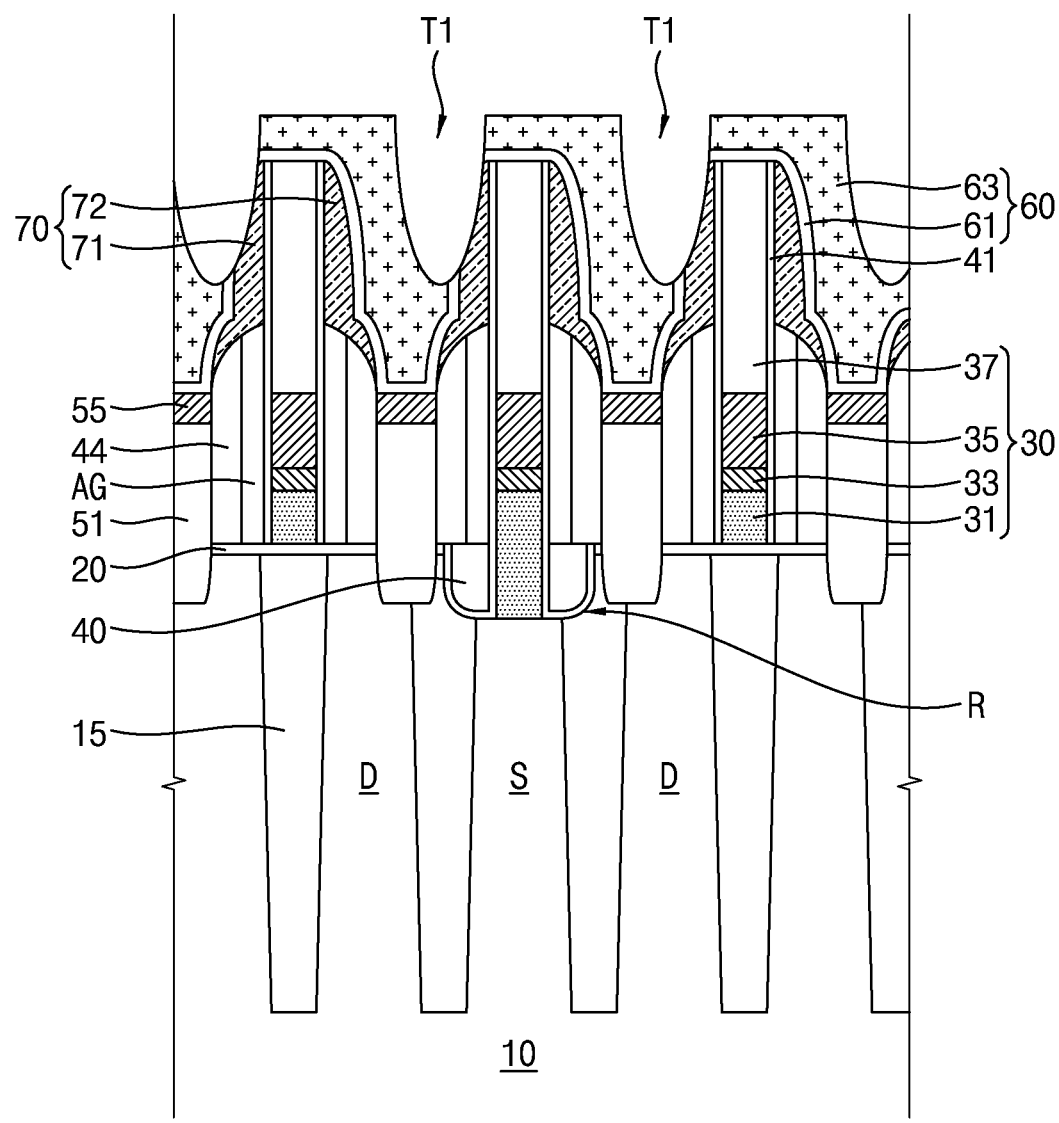

Referring to FIG. 22, the method may include forming a landing pad structure 60 including a landing pad barrier layer 61 and a landing pad 63 by performing an etching process to form a pad isolation trench T1.

Figure 23:
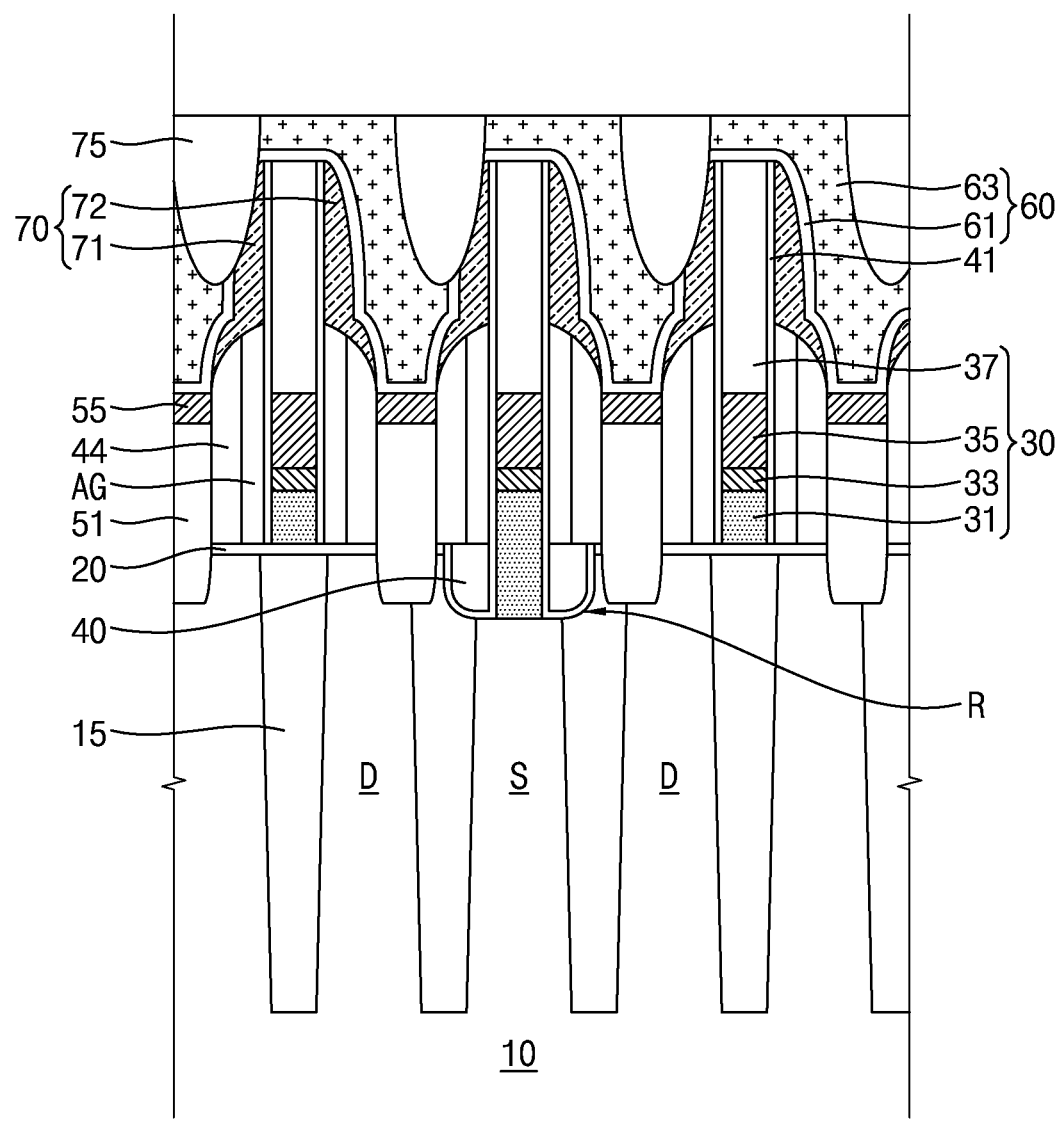

Referring to FIG. 23, the method may include forming a pad isolation insulator 75 in the pad isolation trench T1.

Subsequently, referring to FIG. 2B, the method may include forming a storage structure 80 including a lower storage electrode 81, a storage dielectric layer 83, and an upper storage electrode 85.

According to the embodiments of the present disclosure, a DRAM device having a stably sealed air gap is provided.

According to the embodiments of the present disclosure, sealing layers formed using directional deposition processes seal an air gap, so that the sealing layer having a relatively thin thickness may stably seal the air gap. Thus, the DRAM device may have a pad isolation structure having a relatively small volume, and resistance of the landing pad may decrease.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A DRAM device, comprising:
   an isolation region defining a source region and a drain region disposed in a substrate;
   a first bit line structure disposed on the substrate and connected to the source region;
   a second bit line structure disposed on the isolation region and spaced apart from the first bit line structure in a first horizontal direction with respect to an upper surface of the substrate;
   a first inner spacer vertically extending on a first sidewall of the first bit line structure;
   a first outer spacer spaced apart from the first inner spacer in the first horizontal direction, wherein a lower end of the first outer spacer is higher than a lower end of the first inner spacer;
   a first air gap is disposed between the first inner spacer and the first outer spacer;
   a storage contact disposed on the substrate between the first bit line structure and the second bit line structure to be connected to the drain region;
   a landing pad structure on the storage contact, wherein a stacked structure of the landing pad structure and the storage contact is disposed between the first bit line structure and the second bit line structure;
   a sealing layer and a pad isolation insulator disposed in a pad isolation trench between the first bit line structure and the landing pad structure; and
   a storage structure on the landing pad structure,
   wherein the first inner spacer and the first outer spacer define opposite sides of the first air gap,
   wherein the sealing layer includes:
      a first sealing layer formed on a first sidewall of the pad isolation trench, contacting an upper end of the first inner spacer and an upper end of the first outer spacer, and sealing a top of the first air gap; and
      a second sealing layer formed on a second sidewall of the pad isolation trench,
   wherein the first sealing layer and the second sealing layer are physically detached from each other,
   wherein the first air gap is in contact with the first sealing layer, and
   wherein the landing pad structure includes a landing pad barrier layer in contact with the first sealing layer.

2. The DRAM device of claim 1, further comprising:
   a recess trench recessed from a bottom surface of the pad isolation trench toward the first air gap,
   wherein the first sealing layer is disposed on an inner surface of the recess trench to seal the top of the first air gap.

3. The DRAM device of claim 2, wherein the pad isolation insulator is disposed in the recess trench.

4. The DRAM device of claim 2, wherein the second sealing layer is not formed in the recess trench.

5. The DRAM device of claim 2, wherein:
   the landing pad structure further includes a landing pad,
   a first portion of the landing pad is in contact with the second sealing layer in the pad isolation trench and disposed between the second bit line structure and the second sealing layer, and
   a second portion of the landing pad is in contact with the pad isolation insulator in the recess trench.

6. The DRAM device of claim 5, wherein the landing pad barrier layer is in contact with, in the recess trench, at least one of the pad isolation insulator and the first sealing layer.

7. The DRAM device of claim 1, wherein each of the first sealing layer and the second sealing layer includes an upper portion having a first horizontal thickness and a lower portion having a second horizontal thickness less than the first horizontal thickness.

8. The DRAM device of claim 1, further comprising:
   a second inner spacer vertically extending on a second sidewall, opposite the first sidewall, of the first bit line structure;
   a second outer spacer spaced apart from the second inner spacer in the first horizontal direction;
   a second air gap is disposed between the second inner spacer and the second outer spacer;
   a capping spacer sealing a top of the second air gap.

9. The DRAM device of claim 8, wherein
   the capping spacer is conformally disposed on an outer sidewall of an upper portion of the second inner spacer, and an upper surface of the second outer spacer.

10. The DRAM device of claim 1,
    wherein the landing pad structure further includes a landing pad,
    a first portion of the landing pad is in contact with the second sealing layer in the pad isolation trench, and
    wherein a second portion of the landing pad is in contact with, at a bottom surface of the pad isolation trench, the pad isolation insulator.

11. The DRAM device of claim 10, wherein the landing pad barrier layer is in contact with, at the bottom surface of the pad isolation trench, the pad isolation insulator.

12. The DRAM device of claim 1, further comprising:
    a third air gap disposed between the storage contact and the second bit line structure; and
    an interlayer insulating layer disposed between the isolation region and the second bit line structure,
    wherein the interlayer insulating layer seals a bottom of the third air gap.

13. The DRAM device of claim 1, further comprising:
    a recess filler vertically between the source region and the first air gap,
    wherein the first bit line structure includes a bit line contact, a bit line barrier layer, a bit line electrode, and a bit line capping layer,
    wherein the recess filler, in the first horizontal direction, is between a lower portion of the storage contact and a lower portion of the bit line contact,
    wherein the recess filler seals a bottom of the first air gap, and wherein an upper surface of the recess filler contacts a bottom surface of the first outer spacer.

14. A DRAM device comprising:
an isolation region disposed in a substrate to define a source region and a drain region;
a first bit line structure disposed on the substrate and connected to the source region;
an inner spacer, an air gap, an outer spacer, and a first sealing layer disposed on a first sidewall of the first bit line structure;
a storage contact disposed on the substrate and connected to the drain region;
a landing pad structure vertically on the storage contact;
a pad isolation insulator disposed in a pad isolation trench between the first bit line structure and the landing pad structure, wherein the pad isolation insulator contacts the first sealing layer;
a storage structure vertically on the landing pad structure; and
a recess filler vertically between the source region and the air gap,
wherein an upper surface of the recess filler contacts a bottom surface of the outer spacer,
wherein:
the inner spacer and the outer spacer define opposite sides of the air gap,
the first sealing layer is disposed on an outer surface of an upper portion of the inner spacer and an upper surface of the outer spacer, and seals a top of the air gap,
the landing pad structure includes a landing pad barrier layer conformally formed on an outer surface of the first sealing layer, and a landing pad on the landing pad barrier layer,
the air gap contacts a lower surface of the first sealing layer,
the landing pad barrier layer contacts the outer surface of the first sealing layer,
a first sidewall of the pad isolation insulator is in contact with the landing pad,
a second sidewall of the pad isolation insulator is in contact with at least one of the landing pad barrier layer, the first sealing layer, the inner spacer, and the first bit line structure, and
a lower portion of the pad isolation insulator and a portion of the second sidewall of the pad isolation insulator are in contact with the landing pad barrier layer.

15. The DRAM device of claim 14, further comprising:
a second bit line structure spaced apart from the first bit line structure; and
a second sealing layer disposed on a second sidewall of the second bit line structure and being not in contact with the pad isolation insulator.

16. The DRAM device of claim 14,
wherein the first sealing layer has a spacer shape disposed on an upper portion of the air gap and the outer spacer.

17. The DRAM device of claim 14, wherein:
the first sealing layer exposes a portion of an outer surface of the outer spacer, and
the exposed portion of the outer surface of the outer spacer is in contact with the landing pad barrier layer.

18. The DRAM device of claim 14,
wherein a portion of an upper sidewall of the inner spacer is exposed without being covered by the first sealing layer.

19. The DRAM device of claim 14,
wherein a portion of an exposed upper sidewall of the inner spacer is in contact with the landing pad barrier layer.

20. A DRAM device comprising:
an isolation region disposed in a substrate to define a source region and a drain region;
a bit line structure disposed on the substrate and connected to the source region;
an inner spacer, an air gap, and an outer spacer disposed on a first sidewall of the bit line structure;
a storage contact disposed on the substrate and connected to the drain region;
a landing pad structure on the storage contact;
a pad isolation trench between the bit line structure and the landing pad structure, and a recess trench below the pad isolation trench;
a sealing layer and a pad isolation insulator disposed in the pad isolation trench and the recess trench; and
a storage structure on the landing pad structure,
wherein the inner spacer and the outer spacer define opposite sides of the air gap, and
wherein the sealing layer includes:
a first sealing layer formed on a first sidewall of the pad isolation trench and an inner surface of the recess trench, wherein the first sealing layer contacts an upper end of the inner spacer and an upper end of the outer spacer to seal a top of the air gap; and
a second sealing layer formed on a second sidewall of the pad isolation trench and not formed on the inner surface of the recess trench,
wherein the first sealing layer and the second sealing layer are physically detached from each other,
wherein the first sealing layer seals a top of the air gap,
wherein the air gap is in contact with the first sealing layer, and
wherein the landing pad structure includes a landing pad barrier layer in contact with the first sealing layer.

* * * * *